(12) United States Patent
Beckhardt et al.

(10) Patent No.: US 11,831,288 B2
(45) Date of Patent: Nov. 28, 2023

(54) TECHNIQUES FOR ENABLING INTEROPERABILITY BETWEEN MEDIA PLAYBACK SYSTEMS

(71) Applicant: Sonos, Inc., Santa Barbara, CA (US)

(72) Inventors: Steven Beckhardt, Boston, MA (US); Kyle Seaman, Bedford, MA (US)

(73) Assignee: Sonos, Inc., Santa Barbara, CA (US)

( * ) Notice: Subject to any disclaimer, the term of this patent is extended or adjusted under 35 U.S.C. 154(b) by 0 days.

(21) Appl. No.: 17/508,028

(22) Filed: Oct. 22, 2021

(65) Prior Publication Data

US 2022/0131511 A1 Apr. 28, 2022

Related U.S. Application Data

(60) Provisional application No. 63/105,042, filed on Oct. 23, 2020.

(51) Int. Cl.
| | |
|---|---|
| H04R 3/12 | (2006.01) |
| H03G 5/02 | (2006.01) |
| H04R 5/04 | (2006.01) |
| H03G 1/02 | (2006.01) |
| H04R 27/00 | (2006.01) |

(52) U.S. Cl.
CPC .............. *H03G 5/025* (2013.01); *H03G 1/02* (2013.01); *H04R 5/04* (2013.01); *H04R 27/00* (2013.01); *H04R 2227/005* (2013.01)

(58) Field of Classification Search
CPC . H04R 3/12; H04R 5/04; H04R 27/00; H04R 2227/005
USPC ....................................... 381/109, 77–82, 98
See application file for complete search history.

(56) References Cited

U.S. PATENT DOCUMENTS

| | | |
|---|---|---|
| 5,440,644 A | 8/1995 | Farinelli et al. |
| 5,761,320 A | 6/1998 | Farinelli et al. |
| 5,923,902 A | 7/1999 | Inagaki |
| 6,032,202 A | 2/2000 | Lea et al. |
| 6,256,554 B1 | 7/2001 | DiLorenzo |
| 6,404,811 B1 | 6/2002 | Cvetko et al. |

(Continued)

FOREIGN PATENT DOCUMENTS

| | | |
|---|---|---|
| EP | 1389853 A1 | 2/2004 |
| WO | 200153994 | 7/2001 |
| WO | 2003093950 A2 | 11/2003 |

OTHER PUBLICATIONS

AudioTron Quick Start Guide, Version 1.0, Mar. 2001, 24 pages.

(Continued)

*Primary Examiner* — Disler Paul

(57) ABSTRACT

A device is configured to (i) receive media content from a media source, (ii) generate a first series of frames including first portions of the media content and first playback timing information, (iii) generate a second series of frames including second portions of the media content and second playback timing information, (iv) transmit the first series of frames to a first playback device in a synchrony group for playback of the first portions of the media content in accordance with the first playback timing information, and (v) transmit the second series of frames to a second playback device in the synchrony group for playback of the second portions of the media content in accordance with the second playback timing information such that the media content is played back in synchrony by the synchrony group.

20 Claims, 18 Drawing Sheets

(56) References Cited

U.S. PATENT DOCUMENTS

| | | |
|---|---|---|
| 6,469,633 B1 | 10/2002 | Wachter |
| 6,522,886 B1 | 2/2003 | Youngs et al. |
| 6,611,537 B1 | 8/2003 | Edens et al. |
| 6,631,410 B1 | 10/2003 | Kowalski et al. |
| 6,757,517 B2 | 6/2004 | Chang |
| 6,778,869 B2 | 8/2004 | Champion |
| 7,130,608 B2 | 10/2006 | Hollstrom et al. |
| 7,130,616 B2 | 10/2006 | Janik |
| 7,143,939 B2 | 12/2006 | Henzerling |
| 7,236,773 B2 | 6/2007 | Thomas |
| 7,295,548 B2 | 11/2007 | Blank et al. |
| 7,391,791 B2 | 6/2008 | Balassanian et al. |
| 7,483,538 B2 | 1/2009 | McCarty et al. |
| 7,571,014 B1 | 8/2009 | Lambourne et al. |
| 7,630,501 B2 | 12/2009 | Blank et al. |
| 7,643,894 B2 | 1/2010 | Braithwaite et al. |
| 7,657,910 B1 | 2/2010 | McAulay et al. |
| 7,853,341 B2 | 12/2010 | McCarty et al. |
| 7,987,294 B2 | 7/2011 | Bryce et al. |
| 8,014,423 B2 | 9/2011 | Thaler et al. |
| 8,045,952 B2 | 10/2011 | Qureshey et al. |
| 8,103,009 B2 | 1/2012 | McCarty et al. |
| 8,234,395 B2 | 7/2012 | Millington |
| 8,483,853 B1 | 7/2013 | Lambourne |
| 8,942,252 B2 | 1/2015 | Balassanian et al. |
| 9,877,130 B2 * | 1/2018 | Jia ................... H04S 1/007 |
| 10,433,057 B2 * | 10/2019 | Banerjee ........... H04W 56/0015 |
| 10,474,424 B2 * | 11/2019 | Tanaka ............... G06F 3/165 |
| 10,805,728 B2 * | 10/2020 | Banerjee ............ H04R 27/00 |
| 11,019,438 B2 * | 5/2021 | Mayman ............ H04R 3/12 |
| 11,277,691 B2 * | 3/2022 | Girardier .......... H04W 56/001 |
| 2001/0042107 A1 | 11/2001 | Palm |
| 2002/0022453 A1 | 2/2002 | Balog et al. |
| 2002/0026442 A1 | 2/2002 | Lipscomb et al. |
| 2002/0124097 A1 | 9/2002 | Isely et al. |
| 2003/0157951 A1 | 8/2003 | Hasty, Jr. |
| 2004/0024478 A1 | 2/2004 | Hans et al. |
| 2007/0142944 A1 | 6/2007 | Goldberg et al. |
| 2018/0098151 A1* | 4/2018 | Penke .................. H04R 3/12 |

OTHER PUBLICATIONS

AudioTron Reference Manual, Version 3.0, May 2002, 70 pages.

AudioTron Setup Guide, Version 3.0, May 2002, 38 pages.

Bluetooth. "Specification of the Bluetooth System: The ad hoc SCATTERNET for affordable and highly functional wireless connectivity," Core, Version 1.0 A, Jul. 26, 1999, 1068 pages.

Bluetooth. "Specification of the Bluetooth System: Wireless connections made easy," Core, Version 1.0 B, Dec. 1, 1999, 1076 pages.

Dell, Inc. "Dell Digital Audio Receiver: Reference Guide," Jun. 2000, 70 pages.

Dell, Inc. "Start Here," Jun. 2000, 2 pages.

"Denon 2003-2004 Product Catalog," Denon, 2003-2004, 44 pages.

Jo et al., "Synchronized One-to-many Media Streaming with Adaptive Playout Control," Proceedings of SPIE, 2002, pp. 71-82, vol. 4861.

Jones, Stephen, "Dell Digital Audio Receiver: Digital upgrade for your analog stereo," Analog Stereo, Jun. 24, 2000 http://www.reviewsonline.com/articles/961906864.htm retrieved Jun. 18, 2014, 2 pages.

Louderback, Jim, "Affordable Audio Receiver Furnishes Homes With MP3," TechTV Vault. Jun. 28, 2000 retrieved Jul. 10, 2014, 2 pages.

Palm, Inc., "Handbook for the Palm VII Handheld," May 2000, 311 pages.

Presentations at WinHEC 2000, May 2000, 138 pages.

United States Patent and Trademark Office, U.S. Appl. No. 60/490,768, filed Jul. 28, 2003, entitled "Method for synchronizing audio playback between multiple networked devices," 13 pages.

United States Patent and Trademark Office, U.S. Appl. No. 60/825,407, filed Sep. 12, 2006, entitled "Controlling and manipulating groupings in a multi-zone music or media system," 82 pages.

UPnP; "Universal Plug and Play Device Architecture," Jun. 8, 2000; version 1.0; Microsoft Corporation; pp. 1-54.

Yamaha DME 64 Owner's Manual; copyright 2004, 80 pages.

Yamaha DME Designer 3.5 setup manual guide; copyright 2004, 16 pages.

Yamaha DME Designer 3.5 User Manual; Copyright 2004, 507 pages.

\* cited by examiner

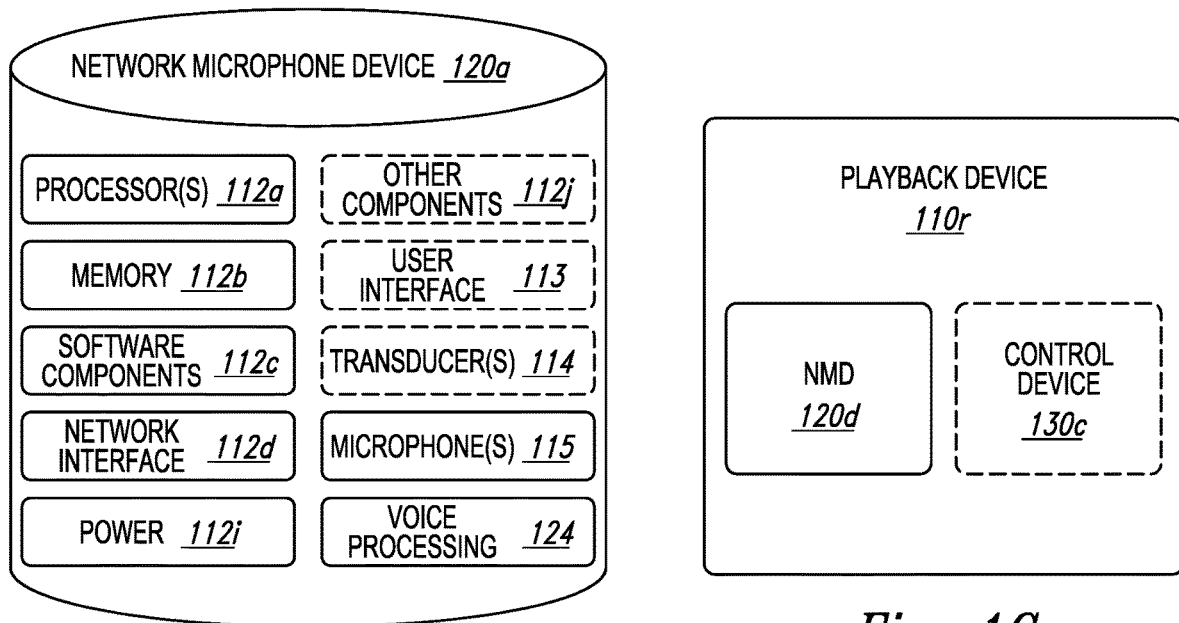
*Fig. 1F*
*Fig. 1G*
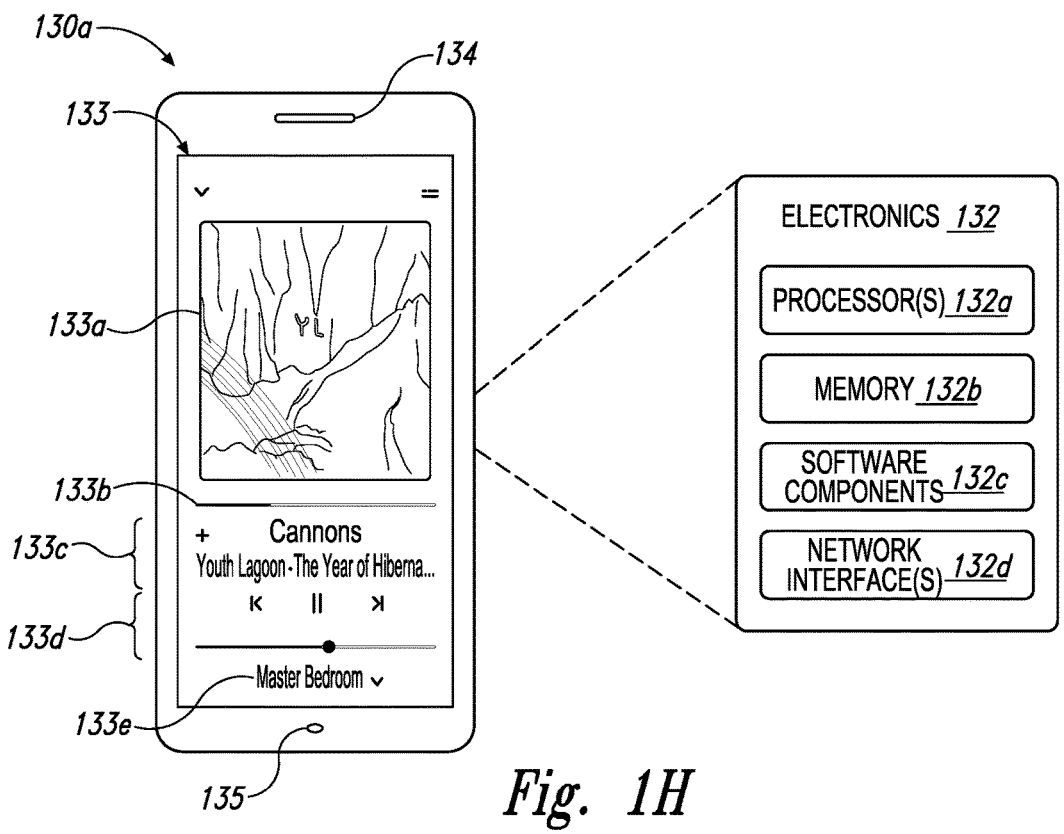
*Fig. 1H*

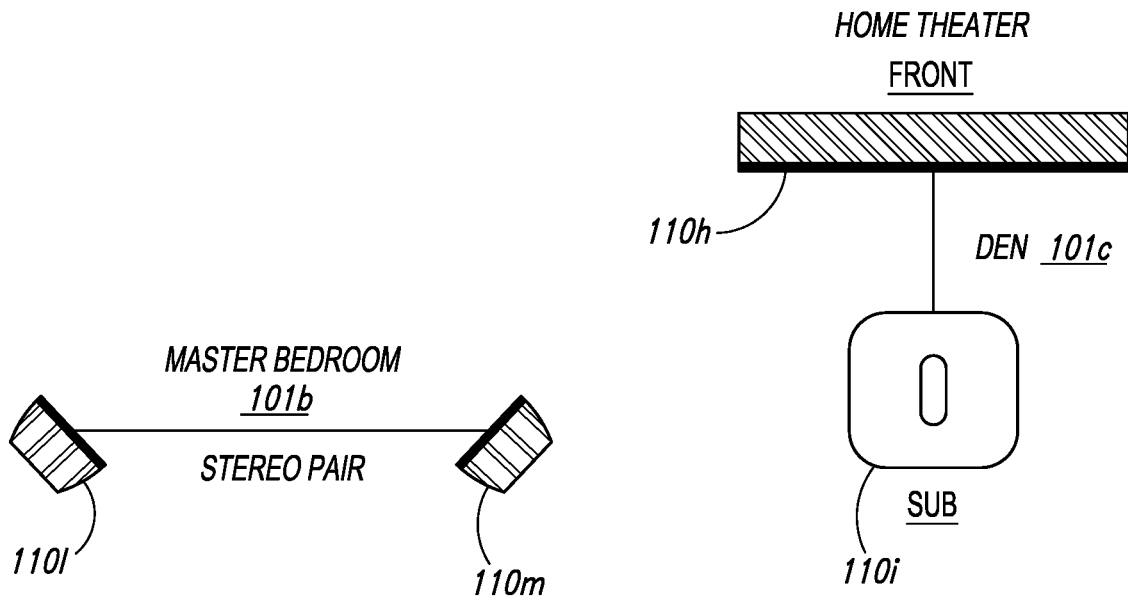
Fig. 1I
Fig. 1J
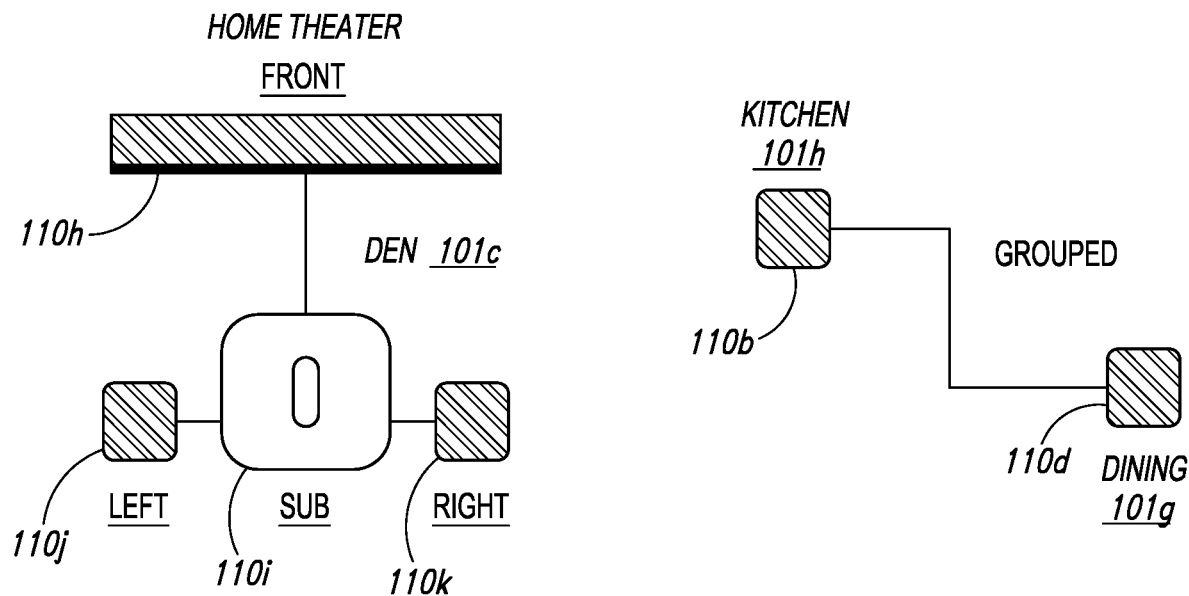
Fig. 1K
Fig. 1L

TECHNIQUES FOR ENABLING INTEROPERABILITY BETWEEN MEDIA PLAYBACK SYSTEMS

CROSS REFERENCE TO RELATED APPLICATIONS

This application claims priority to U.S. Provisional Patent Application No. 63/105,042, filed on Oct. 23, 2020, titled "INTEROPERABILITY BETWEEN MEDIA PLAYBACK SYSTEMS," which is incorporated herein by reference in its entirety.

FIELD OF THE DISCLOSURE

The present disclosure is related to consumer goods and, more particularly, to methods, systems, products, features, services, and other elements directed to media playback or some aspect thereof.

BACKGROUND

Options for accessing and listening to digital audio in an out-loud setting were limited until in 2002, when SONOS, Inc. began development of a new type of playback system. Sonos then filed one of its first patent applications in 2003, entitled "Method for Synchronizing Audio Playback between Multiple Networked Devices," and began offering its first media playback systems for sale in 2005. The Sonos Wireless Home Sound System enables people to experience music from many sources via one or more networked playback devices. Through a software control application installed on a controller (e.g., smartphone, tablet, computer, voice input device), one can play what she wants in any room having a networked playback device. Media content (e.g., songs, podcasts, video sound) can be streamed to playback devices such that each room with a playback device can play back corresponding different media content. In addition, rooms can be grouped together for synchronous playback of the same media content, and/or the same media content can be heard in all rooms synchronously.

BRIEF DESCRIPTION OF THE DRAWINGS

Features, aspects, and advantages of the presently disclosed technology may be better understood with regard to the following description, appended claims, and accompanying drawings, as listed below. A person skilled in the relevant art will understand that the features shown in the drawings are for purposes of illustrations, and variations, including different and/or additional features and arrangements thereof, are possible.

FIG. 1F shows a block diagram of a network microphone device.

FIG. 1G shows a block diagram of a playback device.

FIG. 1H shows a partially schematic diagram of a control device.

FIGS. 1I through 1L show schematic diagrams of corresponding media playback system zones.

Figure 1A:
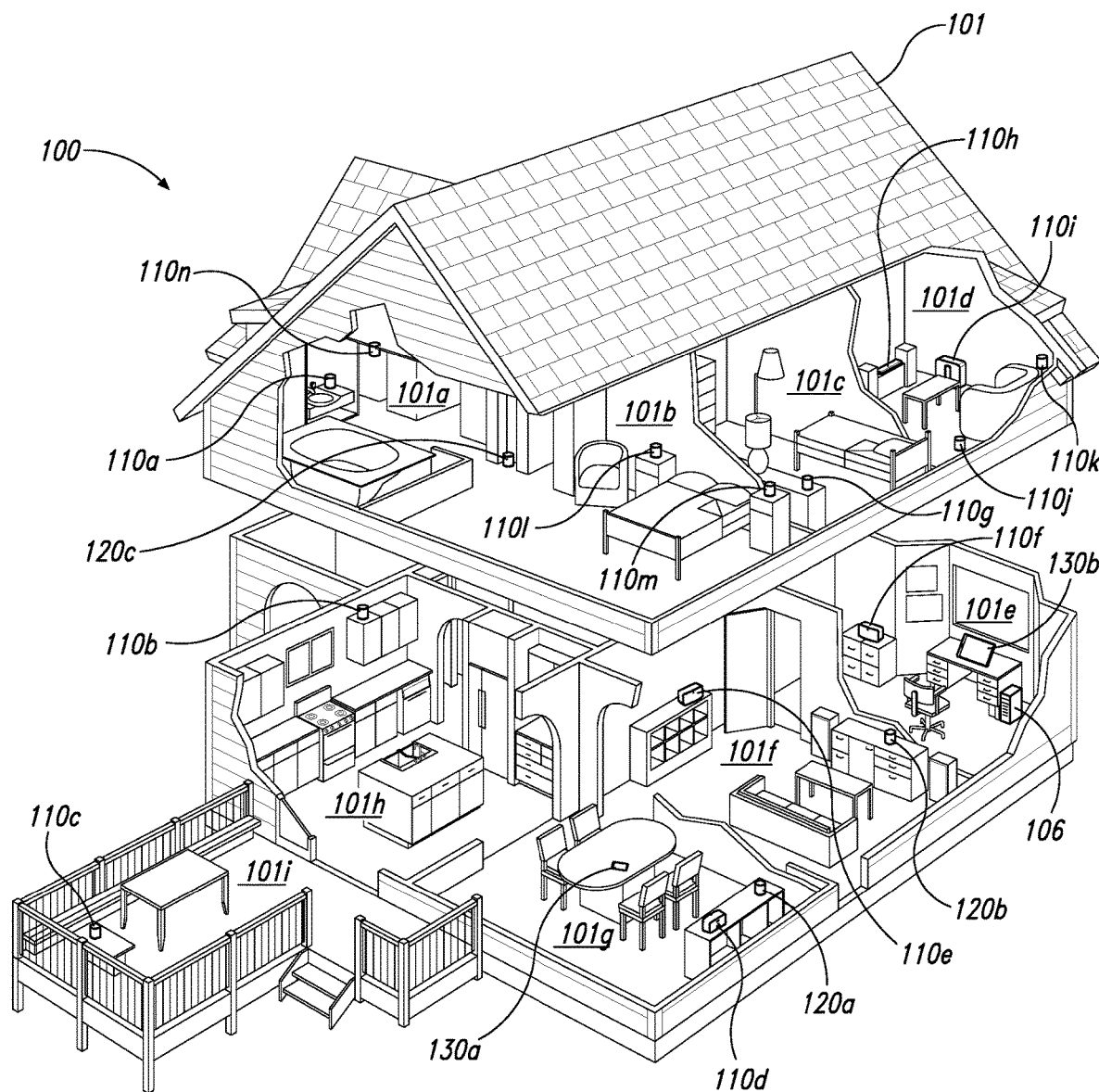
FIG. 1A shows a partial cutaway view of an environment having a media playback system configured in accordance with aspects of the disclosed technology.

The drawings are for the purpose of illustrating example embodiments, but those of ordinary skill in the art will understand that the technology disclosed herein is not limited to the arrangements and/or instrumentality shown in the drawings.

DETAILED DESCRIPTION

I. Overview

SONOS, Inc. has a long history of expanding the interoperability between SONOS products and other products, services, and ecosystems to give end-consumers unparalleled choices between media sources, voice assistant providers, and control mechanisms. For example, SONOS invented virtual line-in (VLI) that, among other things, facilitates synchronous playback of media content from any VLI sender (e.g., a smartphone, a tablet, a laptop, a playback device in another media playback system, etc.) to expand the range of input media sources supported by SONOS products. Further, VLI may facilitate grouping of players from different media playback systems for synchronous playback to give users the ability to arbitrarily group devices from different manufacturers for synchronous playback. Such VLI technologies, among others, are described in U.S. Pat. No. 10,649,718 and U.S. Patent Publication No. 2019/0075335, each of which is hereby incorporated herein by reference in its entirety.

One technical challenge in expanding interoperability between SONOS products and Internet-Of-Things (IoT) devices (e.g., smart speakers, etc.) made by other manufacturers is the limited computing resources available on many of such IoT products. For example, many IoT devices are implemented without an application processor (e.g., ARM CORTEX-A series processors) capable of running a general-purpose operating system (e.g., WINDOWS, MACOS, ANDROID, IOS, LINUX, etc.). Instead, such IoT devices employ only one or more less sophisticated processors (e.g., an ARM COTREX-M series processor) that executes a real-time operating system (RTOS) or have no operating system altogether. Further, such IoT devices typically have limited memory (e.g., limited volatile memory, such as Random Access Memory (RAM), and/or non-volatile memory, such as flash memory). Thus, such IoT devices are generally not capable of performing the same type of sophisticated operations performed by a typical SONOS product without a complete hardware re-design and a drastic increase in manufacturing cost.

Accordingly, aspects of the present disclosure relate to the employment of multiple communication and/or operating schemes for different classes of devices. In some instances, a first scheme may be employed for operations and/or communications between devices of a first class and a second scheme may be employed for operations and/or communications between devices of a first class and devices of a second, different class. For example, in the context of audio synchronization, a group coordinator for a synchrony group comprising a plurality of group members may distribute media content, clock timing information, and/or playback timing information in accordance with a first scheme to group members of a first class (e.g., group members with computation resources that exceed one or more thresholds (e.g., sufficient processor capability (e.g., sufficient number of cores, sufficient floating point operations per second, sufficient clock speed, and/or sufficient cache size), sufficient volatile memory capability (e.g., sufficient capacity, sufficient bandwidth, and/or sufficient clock speed), and/or sufficient non-volatile memory capability (e.g., sufficient capacity, sufficient bandwidth, and/or sufficient clock speed))) and in according with a second, different scheme to group members of a second, different class (e.g., group members with computation resources that do not exceed the one or more thresholds (e.g., insufficient processor capability (e.g., insufficient number of cores, insufficient floating point operations per second, insufficient clock speed, and/or insufficient cache size), insufficient volatile memory capability (e.g., insufficient capacity, insufficient bandwidth, and/or insufficient clock speed), and/or insufficient non-volatile memory capability (e.g., insufficient capacity, insufficient bandwidth, and/or insufficient clock speed))). In this example, the group coordinator may perform one or more operations in accordance with the second scheme that reduce the computational burden on the group members of the second class. For instance, the group coordinator may decode encoded media content prior to transmission to group members of the second class (e.g., to alleviate the computational burden on such group members) while transmitting encoded media content to group members of the first class (e.g., to reduce the bandwidth required to transmit the media content to all of the group members). As a result of implementing multiple communication and/or operating schemes, a media playback system may advantageously be able to be interoperable with a wider range of existing IoT devices without having to sacrifice functionality on more capable (e.g., less resource constrained) devices within the system.

It should be appreciated that the concept of employing different communication and/or operating schemes for devices of different classes is not limited to the content synchronization context. Rather, the concept of different communication and/or operating schemes may be employed in a variety of contexts including, for example, device control (e.g., a first scheme for controlling devices of a first class and a second scheme for controlling devices of a second class) and/or media content distribution (e.g., a first scheme to distribute content to a devices of a first class and a second scheme to distribute content to devices of a second class). For instance, in the context of device control, the mechanism employed for volume control may differ between a first scheme and a second scheme. For example, volume control may be effectuated within a first scheme by exchanging control information without directly modifying the underlying media content itself (e.g., modifying a gain parameter employed for playback of the media content). In contrast, in a second scheme, volume control may be effectuated by directly modifying the media content itself instead of explicitly exchanging control information regarding the media content. Accordingly, the concepts of employing different communication and/or operating schemes may be readily employed in a variety of contexts.

While some examples described herein may refer to functions performed by given actors such as "users," "listeners," and/or other entities, it should be understood that this is for purposes of explanation only. The claims should not be interpreted to require action by any such example actor unless explicitly required by the language of the claims themselves.

In the Figures, identical reference numbers identify generally similar, and/or identical, elements. To facilitate the discussion of any particular element, the most significant digit or digits of a reference number refers to the Figure in which that element is first introduced. For example, element 110a is first introduced and discussed with reference to FIG. 1A. Many of the details, dimensions, angles and other features shown in the Figures are merely illustrative of particular embodiments of the disclosed technology. Accordingly, other embodiments can have other details, dimensions, angles and features without departing from the spirit or scope of the disclosure. In addition, those of ordinary skill in the art will appreciate that further embodiments of the various disclosed technologies can be practiced without several of the details described below.

II. Suitable Operating Environment

FIG. 1A is a partial cutaway view of a media playback system 100 distributed in an environment 101 (e.g., a house). The media playback system 100 comprises one or more playback devices 110 (identified individually as playback devices 110a-n), one or more network microphone devices ("NMDs"), 120 (identified individually as NMDs 120a-c), and one or more control devices 130 (identified individually as control devices 130a and 130b).

As used herein the term "playback device" can generally refer to a network device configured to receive, process, and output data of a media playback system. For example, a playback device can be a network device that receives and processes audio content. In some embodiments, a playback device includes one or more transducers or speakers powered by one or more amplifiers. In other embodiments, however, a playback device includes one of (or neither of) the speaker and the amplifier. For instance, a playback device can comprise one or more amplifiers configured to drive one or more speakers external to the playback device via a corresponding wire or cable.

Moreover, as used herein the term NMD (i.e., a "network microphone device") can generally refer to a network device that is configured for audio detection. In some embodiments, an NMD is a stand-alone device configured primarily for audio detection. In other embodiments, an NMD is incorporated into a playback device (or vice versa).

The term "control device" can generally refer to a network device configured to perform functions relevant to facilitating user access, control, and/or configuration of the media playback system 100.

Each of the playback devices 110 is configured to receive audio signals or data from one or more media sources (e.g., one or more remote servers, one or more local devices) and play back the received audio signals or data as sound. The one or more NMDs 120 are configured to receive spoken word commands, and the one or more control devices 130 are configured to receive user input. In response to the received spoken word commands and/or user input, the media playback system 100 can play back audio via one or more of the playback devices 110. In certain embodiments, the playback devices 110 are configured to commence playback of media content in response to a trigger. For instance, one or more of the playback devices 110 can be configured to play back a morning playlist upon detection of an associated trigger condition (e.g., presence of a user in a kitchen, detection of a coffee machine operation). In some embodiments, for example, the media playback system 100 is configured to play back audio from a first playback device (e.g., the playback device 100a) in synchrony with a second playback device (e.g., the playback device 100b). Interactions between the playback devices 110, NMDs 120, and/or control devices 130 of the media playback system 100 configured in accordance with the various embodiments of the disclosure are described in greater detail below with respect to FIGS. 1B-1L.

In the illustrated embodiment of FIG. 1A, the environment 101 comprises a household having several rooms, spaces, and/or playback zones, including (clockwise from upper left) a master bathroom 101a, a master bedroom 101b, a second bedroom 101c, a family room or den 101d, an office 101e, a living room 101f, a dining room 101g, a kitchen 101h, and an outdoor patio 101i. While certain embodiments and examples are described below in the context of a home environment, the technologies described herein may be implemented in other types of environments. In some embodiments, for example, the media playback system 100 can be implemented in one or more commercial settings (e.g., a restaurant, mall, airport, hotel, a retail or other store), one or more vehicles (e.g., a sports utility vehicle, bus, car, a ship, a boat, an airplane), multiple environments (e.g., a combination of home and vehicle environments), and/or another suitable environment where multi-zone audio may be desirable.

The media playback system 100 can comprise one or more playback zones, some of which may correspond to the rooms in the environment 101. The media playback system 100 can be established with one or more playback zones, after which additional zones may be added, or removed to form, for example, the configuration shown in FIG. 1A. Each zone may be given a name according to a different room or space such as the office 101e, master bathroom 101a, master bedroom 101b, the second bedroom 101c, kitchen 101h, dining room 101g, living room 101f, and/or the patio 101i. In some aspects, a single playback zone may include multiple rooms or spaces. In certain aspects, a single room or space may include multiple playback zones.

In the illustrated embodiment of FIG. 1A, the master bathroom 101a, the second bedroom 101c, the office 101e, the living room 101f, the dining room 101g, the kitchen 101h, and the outdoor patio 101i each include one playback device 110, and the master bedroom 101b and the den 101d include a plurality of playback devices 110. In the master bedroom 101b, the playback devices 110l and 110m may be configured, for example, to play back audio content in synchrony as individual ones of playback devices 110, as a bonded playback zone, as a consolidated playback device, and/or any combination thereof. Similarly, in the den 101d, the playback devices 110h-j can be configured, for instance, to play back audio content in synchrony as individual ones of playback devices 110, as one or more bonded playback devices, and/or as one or more consolidated playback devices. Additional details regarding bonded and consolidated playback devices are described below with respect to, for example, FIGS. 1B and 1E and 1I-1M.

In some aspects, one or more of the playback zones in the environment 101 may each be playing different audio content. For instance, a user may be grilling on the patio 101i and listening to hip hop music being played by the playback device 110c while another user is preparing food in the kitchen 101h and listening to classical music played by the playback device 110b. In another example, a playback zone may play the same audio content in synchrony with another playback zone. For instance, the user may be in the office 101e listening to the playback device 110f playing back the same hip hop music being played back by playback device 110c on the patio 101i. In some aspects, the playback devices 110c and 110f play back the hip hop music in synchrony such that the user perceives that the audio content is being played seamlessly (or at least substantially seamlessly) while moving between different playback zones. Additional details regarding audio playback synchronization among playback devices and/or zones can be found, for example, in U.S. Pat. No. 8,234,395 entitled, "System and method for synchronizing operations among a plurality of independently clocked digital data processing devices," which is incorporated herein by reference in its entirety.

a. Suitable Media Playback System

Figure 1B:
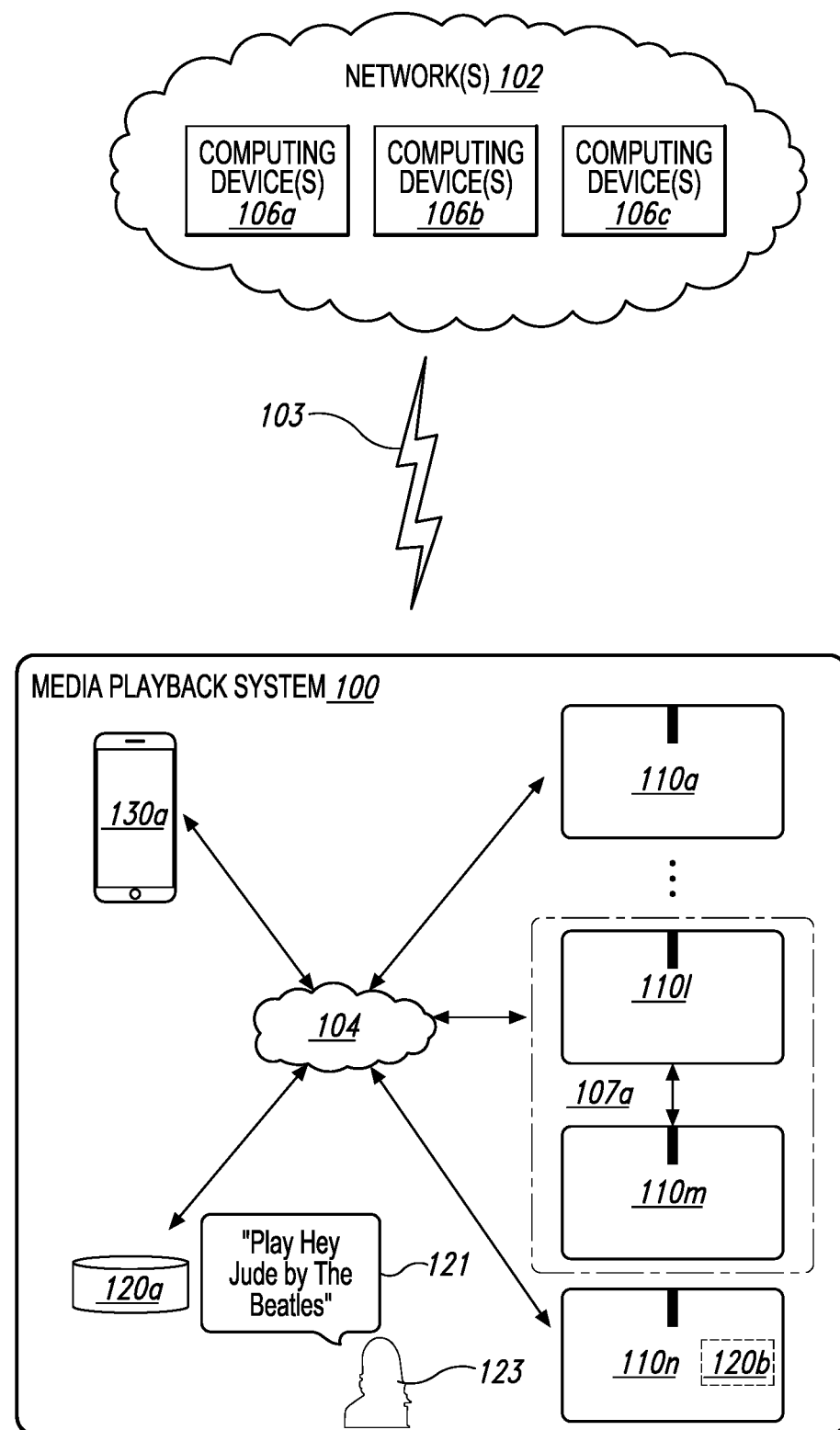
FIG. 1B shows a schematic diagram of the media playback system of FIG. 1A and one or more networks.

FIG. 1B is a schematic diagram of the media playback system 100 and a cloud network 102. For ease of illustration, certain devices of the media playback system 100 and the cloud network 102 are omitted from FIG. 1B. One or more communication links 103 (referred to hereinafter as "the links 103") communicatively couple the media playback system 100 and the cloud network 102.

The links 103 can comprise, for example, one or more wired networks, one or more wireless networks, one or more wide area networks (WAN) (e.g., the Internet), one or more local area networks (LAN) (e.g., one or more WIFI networks), one or more personal area networks (PAN) (e.g., one or more BLUETOOTH networks, Z-WAVE networks, wireless Universal Serial Bus (USB) networks, ZIGBEE networks, and/or IRDA networks), one or more telecommunication networks (e.g., one or more Global System for Mobiles (GSM) networks, Code Division Multiple Access (CDMA) networks, Long-Term Evolution (LTE) networks, 5G communication network networks, and/or other suitable data transmission protocol networks), etc. The cloud network 102 is configured to deliver media content (e.g., audio content, video content, photographs, social media content) to the media playback system 100 in response to a request transmitted from the media playback system 100 via the links 103. In some embodiments, the cloud network 102 is further configured to receive data (e.g. voice input data)

from the media playback system 100 and correspondingly transmit commands and/or media content to the media playback system 100.

The cloud network 102 comprises computing devices 106 (identified separately as a first computing device 106*a*, a second computing device 106*b*, and a third computing device 106*c*). The computing devices 106 can comprise individual computers or servers, such as, for example, a media streaming service server storing audio and/or other media content, a voice service server, a social media server, a media playback system control server, etc. In some embodiments, one or more of the computing devices 106 comprise modules of a single computer or server. In certain embodiments, one or more of the computing devices 106 comprise one or more modules, computers, and/or servers. Moreover, while the cloud network 102 is described above in the context of a single cloud network, in some embodiments the cloud network 102 comprises a plurality of cloud networks comprising communicatively coupled computing devices. Furthermore, while the cloud network 102 is shown in FIG. 1B as having three of the computing devices 106, in some embodiments, the cloud network 102 comprises fewer (or more than) three computing devices 106.

The media playback system 100 is configured to receive media content from the networks 102 via the links 103. The received media content can comprise, for example, a Uniform Resource Identifier (URI) and/or a Uniform Resource Locator (URL). For instance, in some examples, the media playback system 100 can stream, download, or otherwise obtain data from a URI or a URL corresponding to the received media content. A network 104 communicatively couples the links 103 and at least a portion of the devices (e.g., one or more of the playback devices 110, NMDs 120, and/or control devices 130) of the media playback system 100. The network 104 can include, for example, a wireless network (e.g., a WiFi network, a Bluetooth, a Z-Wave network, a ZigBee, and/or other suitable wireless communication protocol network) and/or a wired network (e.g., a network comprising Ethernet, Universal Serial Bus (USB), and/or another suitable wired communication). As those of ordinary skill in the art will appreciate, as used herein, "WiFi" can refer to several different communication protocols including, for example, Institute of Electrical and Electronics Engineers (IEEE) 802.11a, 802.11b, 802.11g, 802.11n, 802.11ac, 802.11ac, 802.11ad, 802.11af, 802.11ah, 802.11ai, 802.11aj, 802.11aq, 802.11ax, 802.11ay, 802.15, etc. transmitted at 2.4 Gigahertz (GHz), 5 GHz, and/or another suitable frequency.

In some embodiments, the network 104 comprises a dedicated communication network that the media playback system 100 uses to transmit messages between individual devices and/or to transmit media content to and from media content sources (e.g., one or more of the computing devices 106). In certain embodiments, the network 104 is configured to be accessible only to devices in the media playback system 100, thereby reducing interference and competition with other household devices. In other embodiments, however, the network 104 comprises an existing household communication network (e.g., a household WiFi network). In some embodiments, the links 103 and the network 104 comprise one or more of the same networks. In some aspects, for example, the links 103 and the network 104 comprise a telecommunication network (e.g., an LTE network, a 5G network). Moreover, in some embodiments, the media playback system 100 is implemented without the network 104, and devices comprising the media playback system 100 can communicate with each other, for example, via one or more direct or indirect connections, PANs, LANs, telecommunication networks, and/or other suitable communication links.

In some embodiments, audio content sources may be regularly added or removed from the media playback system 100. In some embodiments, for example, the media playback system 100 performs an indexing of media items when one or more media content sources are updated, added to, and/or removed from the media playback system 100. The media playback system 100 can scan identifiable media items in some or all folders and/or directories accessible to the playback devices 110, and generate or update a media content database comprising metadata (e.g., title, artist, album, track length) and other associated information (e.g., URIs, URLs) for each identifiable media item found. In some embodiments, for example, the media content database is stored on one or more of the playback devices 110, network microphone devices 120, and/or control devices 130.

In the illustrated embodiment of FIG. 1B, the playback devices 110*l* and 110*m* comprise a group 107*a*. The playback devices 110*l* and 110*m* can be positioned in different rooms in a household and be grouped together in the group 107*a* on a temporary or permanent basis based on user input received at the control device 130*a* and/or another control device 130 in the media playback system 100. When arranged in the group 107*a*, the playback devices 110*l* and 110*m* can be configured to play back the same or similar audio content in synchrony from one or more audio content sources. In certain embodiments, for example, the group 107*a* comprises a bonded zone in which the playback devices 110*l* and 110*m* comprise left audio and right audio channels, respectively, of multi-channel audio content, thereby producing or enhancing a stereo effect of the audio content. In some embodiments, the group 107*a* includes additional playback devices 110. In other embodiments, however, the media playback system 100 omits the group 107*a* and/or other grouped arrangements of the playback devices 110. Additional details regarding groups and other arrangements of playback devices are described in further detail below with respect to FIGS. 1-I through IM.

The media playback system 100 includes the NMDs 120*a* and 120*d*, each comprising one or more microphones configured to receive voice utterances from a user. In the illustrated embodiment of FIG. 1B, the NMD 120*a* is a standalone device and the NMD 120*d* is integrated into the playback device 110*n*. The NMD 120*a*, for example, is configured to receive voice input 121 from a user 123. In some embodiments, the NMD 120*a* transmits data associated with the received voice input 121 to a voice assistant service (VAS) configured to (i) process the received voice input data and (ii) transmit a corresponding command to the media playback system 100. In some aspects, for example, the computing device 106*c* comprises one or more modules and/or servers of a VAS (e.g., a VAS operated by one or more of SONOS®, AMAZON®, GOOGLE® APPLE®, MICROSOFT®). The computing device 106*c* can receive the voice input data from the NMD 120*a* via the network 104 and the links 103. In response to receiving the voice input data, the computing device 106*c* processes the voice input data (i.e., "Play Hey Jude by The Beatles"), and determines that the processed voice input includes a command to play a song (e.g., "Hey Jude"). The computing device 106*c* accordingly transmits commands to the media playback system 100 to play back "Hey Jude" by the Beatles from a suitable media service (e.g., via one or more of the computing devices 106) on one or more of the playback devices 110.

b. Suitable Playback Devices

Figure 1C:
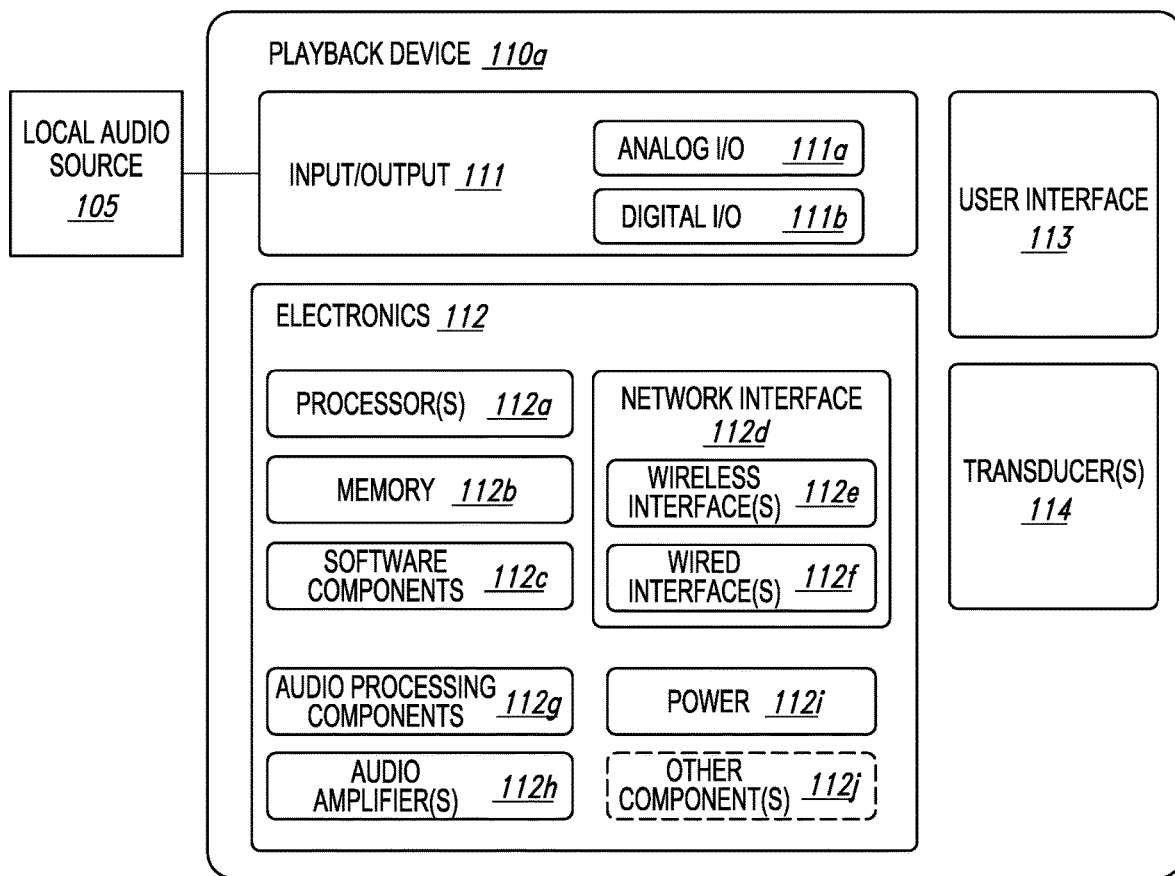
FIG. 1C shows a block diagram of a playback device.

FIG. 1C is a block diagram of the playback device 110a comprising an input/output 111. The input/output 111 can include an analog I/O 111a (e.g., one or more wires, cables, and/or other suitable communication links configured to carry analog signals) and/or a digital I/O 111b (e.g., one or more wires, cables, or other suitable communication links configured to carry digital signals). In some embodiments, the analog I/O 111a is an audio line-in input connection comprising, for example, an auto-detecting 3.5 mm audio line-in connection. In some embodiments, the digital I/O 111b comprises a Sony/Philips Digital Interface Format (S/PDIF) communication interface and/or cable and/or a Toshiba Link (TOSLINK) cable. In some embodiments, the digital I/O 111b comprises an High-Definition Multimedia Interface (HDMI) interface and/or cable. In some embodiments, the digital I/O 111b includes one or more wireless communication links comprising, for example, a radio frequency (RF), infrared, WiFi, Bluetooth, or another suitable communication protocol. In certain embodiments, the analog I/O 111a and the digital I/O 111b comprise interfaces (e.g., ports, plugs, jacks) configured to receive connectors of cables transmitting analog and digital signals, respectively, without necessarily including cables.

The playback device 110a, for example, can receive media content (e.g., audio content comprising music and/or other sounds) from a local audio source 105 via the input/output 111 (e.g., a cable, a wire, a PAN, a Bluetooth connection, an ad hoc wired or wireless communication network, and/or another suitable communication link). The local audio source 105 can comprise, for example, a mobile device (e.g., a smartphone, a tablet, a laptop computer) or another suitable audio component (e.g., a television, a desktop computer, an amplifier, a phonograph, a Blu-ray player, a memory storing digital media files). In some aspects, the local audio source 105 includes local music libraries on a smartphone, a computer, a networked-attached storage (NAS), and/or another suitable device configured to store media files. In certain embodiments, one or more of the playback devices 110, NMDs 120, and/or control devices 130 comprise the local audio source 105. In other embodiments, however, the media playback system omits the local audio source 105 altogether. In some embodiments, the playback device 110a does not include an input/output 111 and receives all audio content via the network 104.

The playback device 110a further comprises electronics 112, a user interface 113 (e.g., one or more buttons, knobs, dials, touch-sensitive surfaces, displays, touchscreens), and one or more transducers 114 (referred to hereinafter as "the transducers 114"). The electronics 112 is configured to receive audio from an audio source (e.g., the local audio source 105) via the input/output 111, one or more of the computing devices 106a-c via the network 104 (FIG. 1B), amplify the received audio, and output the amplified audio for playback via one or more of the transducers 114. In some embodiments, the playback device 110a optionally includes one or more microphones 115 (e.g., a single microphone, a plurality of microphones, a microphone array) (hereinafter referred to as "the microphones 115"). In certain embodiments, for example, the playback device 110a having one or more of the optional microphones 115 can operate as an NMD configured to receive voice input from a user and correspondingly perform one or more operations based on the received voice input.

In the illustrated embodiment of FIG. 1C, the electronics 112 comprise one or more processors 112a (referred to hereinafter as "the processors 112a"), memory 112b, software components 112c, a network interface 112d, one or more audio processing components 112g (referred to hereinafter as "the audio components 112g"), one or more audio amplifiers 112h (referred to hereinafter as "the amplifiers 112h"), and power 112i (e.g., one or more power supplies, power cables, power receptacles, batteries, induction coils, Power-over Ethernet (POE) interfaces, and/or other suitable sources of electric power). In some embodiments, the electronics 112 optionally include one or more other components 112j (e.g., one or more sensors, video displays, touchscreens, battery charging bases).

The processors 112a can comprise clock-driven computing component(s) configured to process data, and the memory 112b can comprise a computer-readable medium (e.g., a tangible, non-transitory computer-readable medium, data storage loaded with one or more of the software components 112c) configured to store instructions for performing various operations and/or functions. The processors 112a are configured to execute the instructions stored on the memory 112b to perform one or more of the operations. The operations can include, for example, causing the playback device 110a to retrieve audio information from an audio source (e.g., one or more of the computing devices 106a-c (FIG. 1B)), and/or another one of the playback devices 110. In some embodiments, the operations further include causing the playback device 110a to send audio information to another one of the playback devices 110a and/or another device (e.g., one of the NMDs 120). Certain embodiments include operations causing the playback device 110a to pair with another of the one or more playback devices 110 to enable a multi-channel audio environment (e.g., a stereo pair, a bonded zone).

The processors 112a can be further configured to perform operations causing the playback device 110a to synchronize playback of audio content with another of the one or more playback devices 110. As those of ordinary skill in the art will appreciate, during synchronous playback of audio content on a plurality of playback devices, a listener will preferably be unable to perceive time-delay differences between playback of the audio content by the playback device 110a and the other one or more other playback devices 110. Additional details regarding audio playback synchronization among playback devices can be found, for example, in U.S. Pat. No. 8,234,395, which was incorporated by reference above.

In some embodiments, the memory 112b is further configured to store data associated with the playback device 110a, such as one or more zones and/or zone groups of which the playback device 110a is a member, audio sources accessible to the playback device 110a, and/or a playback queue that the playback device 110a (and/or another of the one or more playback devices) can be associated with. The stored data can comprise one or more state variables that are periodically updated and used to describe a state of the playback device 110a. The memory 112b can also include data associated with a state of one or more of the other devices (e.g., the playback devices 110, NMDs 120, control devices 130) of the media playback system 100. In some aspects, for example, the state data is shared during predetermined intervals of time (e.g., every 5 seconds, every 10 seconds, every 60 seconds) among at least a portion of the devices of the media playback system 100, so that one or more of the devices have the most recent data associated with the media playback system 100.

The network interface 112d is configured to facilitate a transmission of data between the playback device 110a and one or more other devices on a data network such as, for example, the links 103 and/or the network 104 (FIG. 1B). The network interface 112d is configured to transmit and receive data corresponding to media content (e.g., audio content, video content, text, photographs) and other signals (e.g., non-transitory signals) comprising digital packet data including an Internet Protocol (IP)-based source address and/or an IP-based destination address. The network interface 112d can parse the digital packet data such that the electronics 112 properly receives and processes the data destined for the playback device 110a.

In the illustrated embodiment of FIG. 1C, the network interface 112d comprises one or more wireless interfaces 112e (referred to hereinafter as "the wireless interface 112e"). The wireless interface 112e (e.g., a suitable interface comprising one or more antennae) can be configured to wirelessly communicate with one or more other devices (e.g., one or more of the other playback devices 110, NMDs 120, and/or control devices 130) that are communicatively coupled to the network 104 (FIG. 1B) in accordance with a suitable wireless communication protocol (e.g., WiFi, Bluetooth, LTE). In some embodiments, the network interface 112d optionally includes a wired interface 112f (e.g., an interface or receptacle configured to receive a network cable such as an Ethernet, a USB-A, USB-C, and/or Thunderbolt cable) configured to communicate over a wired connection with other devices in accordance with a suitable wired communication protocol. In certain embodiments, the network interface 112d includes the wired interface 112f and excludes the wireless interface 112e. In some embodiments, the electronics 112 excludes the network interface 112d altogether and transmits and receives media content and/or other data via another communication path (e.g., the input/output 111).

The audio processing components 112g are configured to process and/or filter data comprising media content received by the electronics 112 (e.g., via the input/output 111 and/or the network interface 112d) to produce output audio signals. In some embodiments, the audio processing components 112g comprise, for example, one or more digital-to-analog converters (DAC), audio preprocessing components, audio enhancement components, digital signal processors (DSPs), and/or other suitable audio processing components, modules, circuits, etc. In certain embodiments, one or more of the audio processing components 112g can comprise one or more subcomponents of the processors 112a. In some embodiments, the electronics 112 omits the audio processing components 112g. In some aspects, for example, the processors 112a execute instructions stored on the memory 112b to perform audio processing operations to produce the output audio signals.

The amplifiers 112h are configured to receive and amplify the audio output signals produced by the audio processing components 112g and/or the processors 112a. The amplifiers 112h can comprise electronic devices and/or components configured to amplify audio signals to levels sufficient for driving one or more of the transducers 114. In some embodiments, for example, the amplifiers 112h include one or more switching or class-D power amplifiers. In other embodiments, however, the amplifiers include one or more other types of power amplifiers (e.g., linear gain power amplifiers, class-A amplifiers, class-B amplifiers, class-AB amplifiers, class-C amplifiers, class-D amplifiers, class-E amplifiers, class-F amplifiers, class-G and/or class H amplifiers, and/or another suitable type of power amplifier). In certain embodiments, the amplifiers 112h comprise a suitable combination of two or more of the foregoing types of power amplifiers. Moreover, in some embodiments, individual ones of the amplifiers 112h correspond to individual ones of the transducers 114. In other embodiments, however, the electronics 112 includes a single one of the amplifiers 112h configured to output amplified audio signals to a plurality of the transducers 114. In some other embodiments, the electronics 112 omits the amplifiers 112h.

The transducers 114 (e.g., one or more speakers and/or speaker drivers) receive the amplified audio signals from the amplifier 112h and render or output the amplified audio signals as sound (e.g., audible sound waves having a frequency between about 20 Hertz (Hz) and 20 kilohertz (kHz)). In some embodiments, the transducers 114 can comprise a single transducer. In other embodiments, however, the transducers 114 comprise a plurality of audio transducers. In some embodiments, the transducers 114 comprise more than one type of transducer. For example, the transducers 114 can include one or more low frequency transducers (e.g., subwoofers, woofers), mid-range frequency transducers (e.g., mid-range transducers, mid-woofers), and one or more high frequency transducers (e.g., one or more tweeters). As used herein, "low frequency" can generally refer to audible frequencies below about 500 Hz, "mid-range frequency" can generally refer to audible frequencies between about 500 Hz and about 2 kHz, and "high frequency" can generally refer to audible frequencies above 2 kHz. In certain embodiments, however, one or more of the transducers 114 comprise transducers that do not adhere to the foregoing frequency ranges. For example, one of the transducers 114 may comprise a mid-woofer transducer configured to output sound at frequencies between about 200 Hz and about 5 kHz.

By way of illustration, SONOS, Inc. presently offers (or has offered) for sale certain playback devices including, for example, a "SONOS ONE," "PLAY:1," "PLAY:3," "PLAY:5," "PLAYBAR," "PLAYBASE," "CONNECT:AMP," "CONNECT," and "SUB." Other suitable playback devices may additionally or alternatively be used to implement the playback devices of example embodiments disclosed herein. Additionally, one of ordinary skilled in the art will appreciate that a playback device is not limited to the examples described herein or to SONOS product offerings. In some embodiments, for example, one or more playback devices 110 comprises wired or wireless headphones (e.g., over-the-ear headphones, on-ear headphones, in-ear earphones). The headphone may comprise a headband coupled to one or more earcups. For example, a first earcup may be coupled to a first end of the headband and a second earcup may be coupled to a second end of the headband that is opposite the first end. Each of the one or more earcups may house any portion of the electronic components in the playback device, such as one or more transducers. Further, the one or more of earcups may include a user interface for controlling operation of the headphone such as for controlling audio playback, volume level, and other functions. The user interface may include any of a variety of control elements such as buttons, knobs, dials, touch-sensitive surfaces, and/or touchscreens. An ear cushion may be coupled each of the one or more earcups. The ear cushions may provide a soft barrier between the head of a user and the one or more earcups to improve user comfort and/or provide acoustic isolation from the ambient (e.g., provide passive noise reduction (PNR)). Additionally (or alternatively), the headphone may employ active noise reduction (ANR) techniques to further reduce the user's perception of outside noise during playback.

Figure 1D:
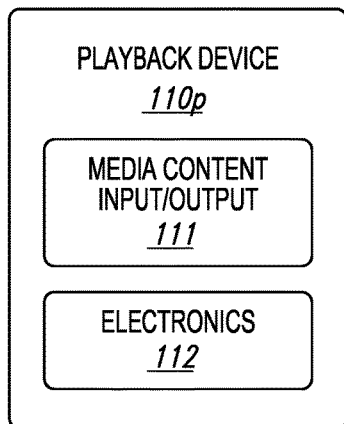
FIG. 1D shows a block diagram of a playback device.

In some embodiments, one or more of the playback devices 110 comprise a docking station and/or an interface configured to interact with a docking station for personal mobile media playback devices. In certain embodiments, a playback device may be integral to another device or component such as a television, a lighting fixture, or some other device for indoor or outdoor use. In some embodiments, a playback device omits a user interface and/or one or more transducers. For example, FIG. 1D is a block diagram of a playback device 110p comprising the input/output 111 and electronics 112 without the user interface 113 or transducers 114.

Figure 1E:
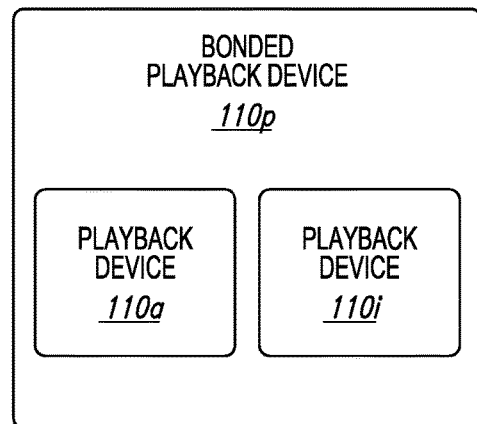
FIG. 1E shows a block diagram of a network microphone device.

FIG. 1E is a block diagram of a bonded playback device 110q comprising the playback device 110a (FIG. 1C) sonically bonded with the playback device 110i (e.g., a subwoofer) (FIG. 1A). In the illustrated embodiment, the playback devices 110a and 110i are separate ones of the playback devices 110 housed in separate enclosures. In some embodiments, however, the bonded playback device 110q comprises a single enclosure housing both the playback devices 110a and 110i. The bonded playback device 110q can be configured to process and reproduce sound differently than an unbonded playback device (e.g., the playback device 110a of FIG. 1C) and/or paired or bonded playback devices (e.g., the playback devices 110l and 110m of FIG. 1B). In some embodiments, for example, the playback device 110a is full-range playback device configured to render low frequency, mid-range frequency, and high frequency audio content, and the playback device 110i is a subwoofer configured to render low frequency audio content. In some aspects, the playback device 110a, when bonded with the first playback device, is configured to render only the mid-range and high frequency components of a particular audio content, while the playback device 110i renders the low frequency component of the particular audio content. In some embodiments, the bonded playback device 110q includes additional playback devices and/or another bonded playback device. Additional playback device embodiments are described in further detail below with respect to FIGS. 2A-3D.

c. Suitable Network Microphone Devices (NMDs)

FIG. 1F is a block diagram of the NMD 120a (FIGS. 1A and 1B). The NMD 120a includes one or more voice processing components 124 (hereinafter "the voice components 124") and several components described with respect to the playback device 110a (FIG. 1C) including the processors 112a, the memory 112b, and the microphones 115. The NMD 120a optionally comprises other components also included in the playback device 110a (FIG. 1C), such as the user interface 113 and/or the transducers 114. In some embodiments, the NMD 120a is configured as a media playback device (e.g., one or more of the playback devices 110), and further includes, for example, one or more of the audio processing components 112g (FIG. 1C), the transducers 114, and/or other playback device components. In certain embodiments, the NMD 120a comprises an Internet of Things (IoT) device such as, for example, a thermostat, alarm panel, fire and/or smoke detector, etc. In some embodiments, the NMD 120a comprises the microphones 115, the voice processing 124, and only a portion of the components of the electronics 112 described above with respect to FIG. 1B. In some aspects, for example, the NMD 120a includes the processor 112a and the memory 112b (FIG. 1B), while omitting one or more other components of the electronics 112. In some embodiments, the NMD 120a includes additional components (e.g., one or more sensors, cameras, thermometers, barometers, hygrometers).

In some embodiments, an NMD can be integrated into a playback device. FIG. 1G is a block diagram of a playback device 110r comprising an NMD 120d. The playback device 110r can comprise many or all of the components of the playback device 110a and further include the microphones 115 and voice processing 124 (FIG. 1F). The playback device 110r optionally includes an integrated control device 130c. The control device 130c can comprise, for example, a user interface (e.g., the user interface 113 of FIG. 1B) configured to receive user input (e.g., touch input, voice input) without a separate control device. In other embodiments, however, the playback device 110r receives commands from another control device (e.g., the control device 130a of FIG. 1B). Additional NMD embodiments are described in further detail below with respect to FIGS. 3A-3F.

Referring again to FIG. 1F, the microphones 115 are configured to acquire, capture, and/or receive sound from an environment (e.g., the environment 101 of FIG. 1A) and/or a room in which the NMD 120a is positioned. The received sound can include, for example, vocal utterances, audio played back by the NMD 120a and/or another playback device, background voices, ambient sounds, etc. The microphones 115 convert the received sound into electrical signals to produce microphone data. The voice processing 124 receives and analyzes the microphone data to determine whether a voice input is present in the microphone data. The voice input can comprise, for example, an activation word followed by an utterance including a user request. As those of ordinary skill in the art will appreciate, an activation word is a word or other audio cue that signifying a user voice input. For instance, in querying the AMAZON® VAS, a user might speak the activation word "Alexa." Other examples include "Ok, Google" for invoking the GOOGLE® VAS and "Hey, Siri" for invoking the APPLE® VAS.

After detecting the activation word, voice processing 124 monitors the microphone data for an accompanying user request in the voice input. The user request may include, for example, a command to control a third-party device, such as a thermostat (e.g., NEST® thermostat), an illumination device (e.g., a PHILIPS HUE® lighting device), or a media playback device (e.g., a Sonos® playback device). For example, a user might speak the activation word "Alexa" followed by the utterance "set the thermostat to 68 degrees" to set a temperature in a home (e.g., the environment 101 of FIG. 1A). The user might speak the same activation word followed by the utterance "turn on the living room" to turn on illumination devices in a living room area of the home. The user may similarly speak an activation word followed by a request to play a particular song, an album, or a playlist of music on a playback device in the home. Additional description regarding receiving and processing voice input data can be found in further detail below with respect to FIGS. 3A-3F.

d. Suitable Control Devices

FIG. 1H is a partially schematic diagram of the control device 130a (FIGS. 1A and 1B). As used herein, the term "control device" can be used interchangeably with "controller" or "control system." Among other features, the control device 130a is configured to receive user input related to the media playback system 100 and, in response, cause one or more devices in the media playback system 100 to perform an action(s) or operation(s) corresponding to the user input. In the illustrated embodiment, the control device 130a comprises a smartphone (e.g., an iPhone™, an Android phone) on which media playback system controller application software is installed. In some embodiments, the control device 130a comprises, for example, a tablet (e.g., an iPad™), a computer (e.g., a laptop computer, a desktop computer), and/or another suitable device (e.g., a television, an automobile audio head unit, an IoT device). In certain embodiments, the control device 130a comprises a dedicated controller for the media playback system 100. In other embodiments, as described above with respect to FIG. 1G, the control device 130a is integrated into another device in the media playback system 100 (e.g., one more of the playback devices 110, NMDs 120, and/or other suitable devices configured to communicate over a network).

The control device 130a includes electronics 132, a user interface 133, one or more speakers 134, and one or more microphones 135. The electronics 132 comprise one or more processors 132a (referred to hereinafter as "the processors 132a"), a memory 132b, software components 132c, and a network interface 132d. The processor 132a can be configured to perform functions relevant to facilitating user access, control, and configuration of the media playback system 100. The memory 132b can comprise data storage that can be loaded with one or more of the software components executable by the processor 302 to perform those functions. The software components 132c can comprise applications and/or other executable software configured to facilitate control of the media playback system 100. The memory 112b can be configured to store, for example, the software components 132c, media playback system controller application software, and/or other data associated with the media playback system 100 and the user.

The network interface 132d is configured to facilitate network communications between the control device 130a and one or more other devices in the media playback system 100, and/or one or more remote devices. In some embodiments, the network interface 132d is configured to operate according to one or more suitable communication industry standards (e.g., infrared, radio, wired standards including IEEE 802.3, wireless standards including IEEE 802.11a, 802.11b, 802.11g, 802.11n, 802.11ac, 802.15, 4G, LTE). The network interface 132d can be configured, for example, to transmit data to and/or receive data from the playback devices 110, the NMDs 120, other ones of the control devices 130, one of the computing devices 106 of FIG. 1B, devices comprising one or more other media playback systems, etc. The transmitted and/or received data can include, for example, playback device control commands, state variables, playback zone and/or zone group configurations. For instance, based on user input received at the user interface 133, the network interface 132d can transmit a playback device control command (e.g., volume control, audio playback control, audio content selection) from the control device 304 to one or more of playback devices. The network interface 132d can also transmit and/or receive configuration changes such as, for example, adding/removing one or more playback devices to/from a zone, adding/removing one or more zones to/from a zone group, forming a bonded or consolidated player, separating one or more playback devices from a bonded or consolidated player, among others. Additional description of zones and groups can be found below with respect to FIGS. 1-I through 1M.

The user interface 133 is configured to receive user input and can facilitate control of the media playback system 100. The user interface 133 includes media content art 133a (e.g., album art, lyrics, videos), a playback status indicator 133b (e.g., an elapsed and/or remaining time indicator), media content information region 133c, a playback control region 133d, and a zone indicator 133e. The media content information region 133c can include a display of relevant information (e.g., title, artist, album, genre, release year) about media content currently playing and/or media content in a queue or playlist. The playback control region 133d can include selectable (e.g., via touch input and/or via a cursor or another suitable selector) icons to cause one or more playback devices in a selected playback zone or zone group to perform playback actions such as, for example, play or pause, fast forward, rewind, skip to next, skip to previous, enter/exit shuffle mode, enter/exit repeat mode, enter/exit cross fade mode, etc. The playback control region 133d may also include selectable icons to modify equalization settings, playback volume, and/or other suitable playback actions. In the illustrated embodiment, the user interface 133 comprises a display presented on a touch screen interface of a smartphone (e.g., an iPhone™, an Android phone). In some embodiments, however, user interfaces of varying formats, styles, and interactive sequences may alternatively be implemented on one or more network devices to provide comparable control access to a media playback system.

The one or more speakers 134 (e.g., one or more transducers) can be configured to output sound to the user of the control device 130a. In some embodiments, the one or more speakers comprise individual transducers configured to correspondingly output low frequencies, mid-range frequencies, and/or high frequencies. In some aspects, for example, the control device 130a is configured as a playback device (e.g., one of the playback devices 110). Similarly, in some embodiments the control device 130a is configured as an NMD (e.g., one of the NMDs 120), receiving voice commands and other sounds via the one or more microphones 135.

The one or more microphones 135 can comprise, for example, one or more condenser microphones, electret condenser microphones, dynamic microphones, and/or other suitable types of microphones or transducers. In some embodiments, two or more of the microphones 135 are arranged to capture location information of an audio source (e.g., voice, audible sound) and/or configured to facilitate filtering of background noise. Moreover, in certain embodiments, the control device 130a is configured to operate as a playback device and an NMD. In other embodiments, however, the control device 130a omits the one or more speakers 134 and/or the one or more microphones 135. For instance, the control device 130a may comprise a device (e.g., a thermostat, an IoT device, a network device) comprising a portion of the electronics 132 and the user interface 133 (e.g., a touch screen) without any speakers or microphones. Additional control device embodiments are described in further detail below with respect to FIGS. 4A-4D and 5.

e. Suitable Playback Device Configurations

FIGS. 1-I through 1M show example configurations of playback devices in zones and zone groups. Referring first to FIG. 1M, in one example, a single playback device may belong to a zone. For example, the playback device 110g in the second bedroom 101c (FIG. 1A) may belong to Zone C. In some implementations described below, multiple playback devices may be "bonded" to form a "bonded pair" which together form a single zone. For example, the playback device 110l (e.g., a left playback device) can be bonded to the playback device 110l (e.g., a left playback device) to form Zone A. Bonded playback devices may have different playback responsibilities (e.g., channel responsibilities). In another implementation described below, multiple playback devices may be merged to form a single zone. For example, the playback device 110h (e.g., a front playback device) may be merged with the playback device 110i (e.g., a subwoofer), and the playback devices 110j and 110k (e.g., left and right surround speakers, respectively) to form a single Zone D. In another example, the playback devices 110g and 110h can be merged to form a merged group or a zone group 108b. The merged playback devices 110g and 110h may not be specifically assigned different playback responsibilities. That is, the merged playback devices 110h and 110i may, aside from playing audio content in synchrony, each play audio content as they would if they were not merged.

Each zone in the media playback system 100 may be provided for control as a single user interface (UI) entity. For example, Zone A may be provided as a single entity named Master Bathroom. Zone B may be provided as a single entity named Master Bedroom. Zone C may be provided as a single entity named Second Bedroom.

Playback devices that are bonded may have different playback responsibilities, such as responsibilities for certain audio channels. For example, as shown in FIG. 1-I, the playback devices 110l and 110m may be bonded so as to produce or enhance a stereo effect of audio content. In this example, the playback device 110l may be configured to play a left channel audio component, while the playback device 110k may be configured to play a right channel audio component. In some implementations, such stereo bonding may be referred to as "pairing."

Figure 1M:
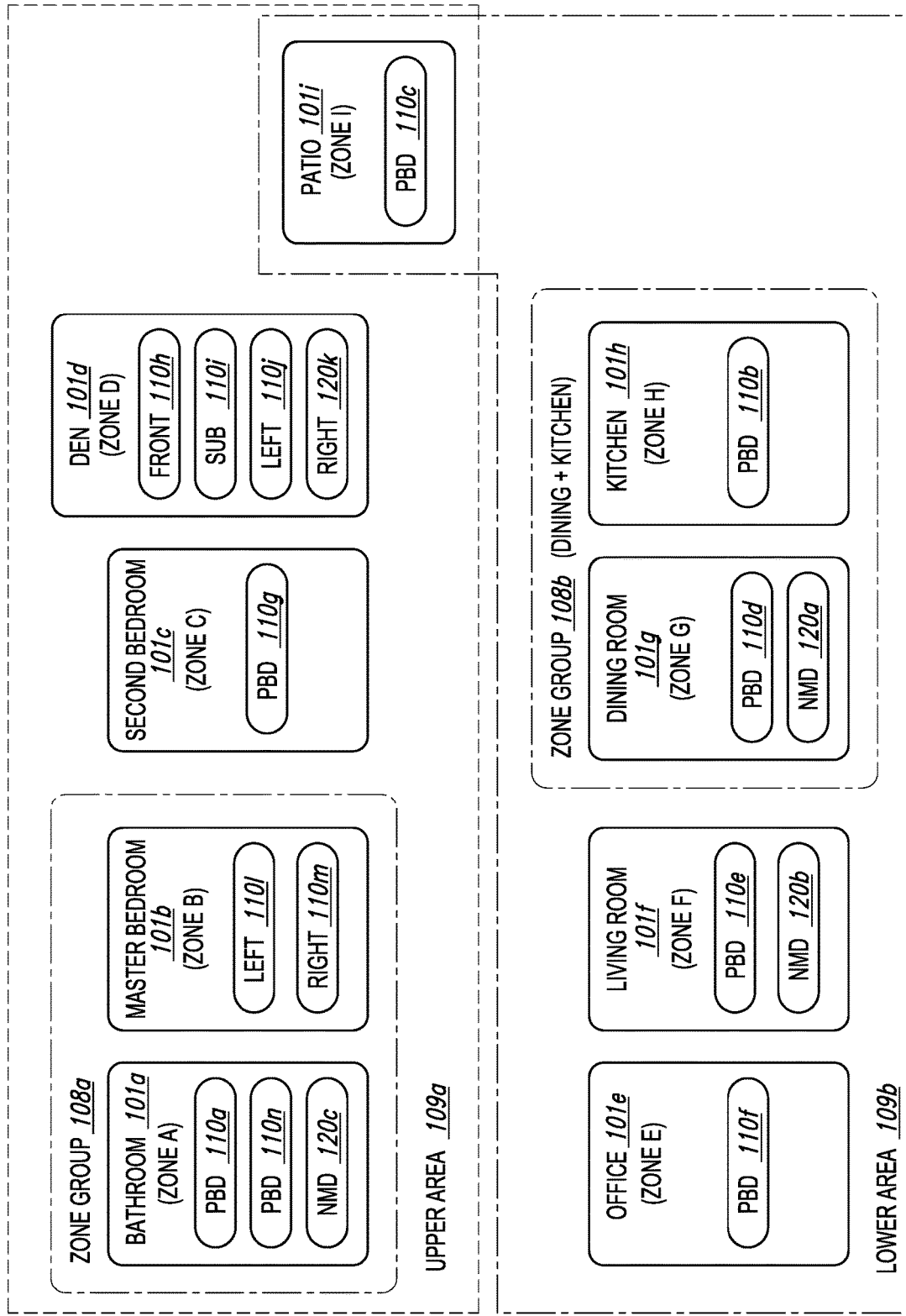
FIG. 1M shows a schematic diagram of media playback system areas.

Additionally, bonded playback devices may have additional and/or different respective speaker drivers. As shown in FIG. 1J, the playback device 110h named Front may be bonded with the playback device 110i named SUB. The Front device 110h can be configured to render a range of mid to high frequencies and the SUB device 110i can be configured render low frequencies. When unbonded, however, the Front device 110h can be configured render a full range of frequencies. As another example, FIG. 1K shows the Front and SUB devices 110h and 110i further bonded with Left and Right playback devices 110j and 110k, respectively. In some implementations, the Right and Left devices 110j and 102k can be configured to form surround or "satellite" channels of a home theater system. The bonded playback devices 110h, 110i, 110j, and 110k may form a single Zone D (FIG. 1M).

Playback devices that are merged may not have assigned playback responsibilities, and may each render the full range of audio content the respective playback device is capable of. Nevertheless, merged devices may be represented as a single UI entity (i.e., a zone, as discussed above). For instance, the playback devices 110a and 110n the master bathroom have the single UI entity of Zone A. In one embodiment, the playback devices 110a and 110n may each output the full range of audio content each respective playback devices 110a and 110n are capable of, in synchrony.

In some embodiments, an NMD is bonded or merged with another device so as to form a zone. For example, the NMD 120b may be bonded with the playback device 110e, which together form Zone F, named Living Room. In other embodiments, a stand-alone network microphone device may be in a zone by itself. In other embodiments, however, a stand-alone network microphone device may not be associated with a zone. Additional details regarding associating network microphone devices and playback devices as designated or default devices may be found, for example, in previously referenced U.S. patent application Ser. No. 15/438,749.

Zones of individual, bonded, and/or merged devices may be grouped to form a zone group. For example, referring to FIG. 1M, Zone A may be grouped with Zone B to form a zone group 108a that includes the two zones. Similarly, Zone G may be grouped with Zone H to form the zone group 108b. As another example, Zone A may be grouped with one or more other Zones C-I. The Zones A-I may be grouped and ungrouped in numerous ways. For example, three, four, five, or more (e.g., all) of the Zones A-I may be grouped. When grouped, the zones of individual and/or bonded playback devices may play back audio in synchrony with one another, as described in previously referenced U.S. Pat. No. 8,234,395. Playback devices may be dynamically grouped and ungrouped to form new or different groups that synchronously play back audio content.

In various implementations, the zones in an environment may be the default name of a zone within the group or a combination of the names of the zones within a zone group. For example, Zone Group 108b can have be assigned a name such as "Dining+Kitchen", as shown in FIG. 1M. In some embodiments, a zone group may be given a unique name selected by a user.

Certain data may be stored in a memory of a playback device (e.g., the memory 112b of FIG. 1C) as one or more state variables that are periodically updated and used to describe the state of a playback zone, the playback device(s), and/or a zone group associated therewith. The memory may also include the data associated with the state of the other devices of the media system, and shared from time to time among the devices so that one or more of the devices have the most recent data associated with the system.

In some embodiments, the memory may store instances of various variable types associated with the states. Variables instances may be stored with identifiers (e.g., tags) corresponding to type. For example, certain identifiers may be a first type "a1" to identify playback device(s) of a zone, a second type "b1" to identify playback device(s) that may be bonded in the zone, and a third type "c1" to identify a zone group to which the zone may belong. As a related example, identifiers associated with the second bedroom 101c may indicate that the playback device is the only playback device of the Zone C and not in a zone group. Identifiers associated with the Den may indicate that the Den is not grouped with other zones but includes bonded playback devices 110h-110k. Identifiers associated with the Dining Room may indicate that the Dining Room is part of the Dining+Kitchen zone group 108b and that devices 110b and 110d are grouped (FIG. 1L). Identifiers associated with the Kitchen may indicate the same or similar information by virtue of the Kitchen being part of the Dining+Kitchen zone group 108b. Other example zone variables and identifiers are described below.

In yet another example, the media playback system 100 may variables or identifiers representing other associations of zones and zone groups, such as identifiers associated with Areas, as shown in FIG. 1M. An area may involve a cluster of zone groups and/or zones not within a zone group. For instance, FIG. 1M shows an Upper Area 109a including Zones A-D, and a Lower Area 109b including Zones E-I. In one aspect, an Area may be used to invoke a cluster of zone groups and/or zones that share one or more zones and/or zone groups of another cluster. In another aspect, this differs from a zone group, which does not share a zone with another zone group. Further examples of techniques for implementing Areas may be found, for example, in U.S. application Ser. No. 15/682,506 filed Aug. 21, 2017 and titled "Room Association Based on Name," and U.S. Pat. No. 8,483,853 filed Sep. 11, 2007, and titled "Controlling and manipulating groupings in a multi-zone media system." Each of these applications is incorporated herein by reference in its entirety. In some embodiments, the media playback system 100 may not implement Areas, in which case the system may not store variables associated with Areas.

III. Example Systems and Devices

Figure 2A:
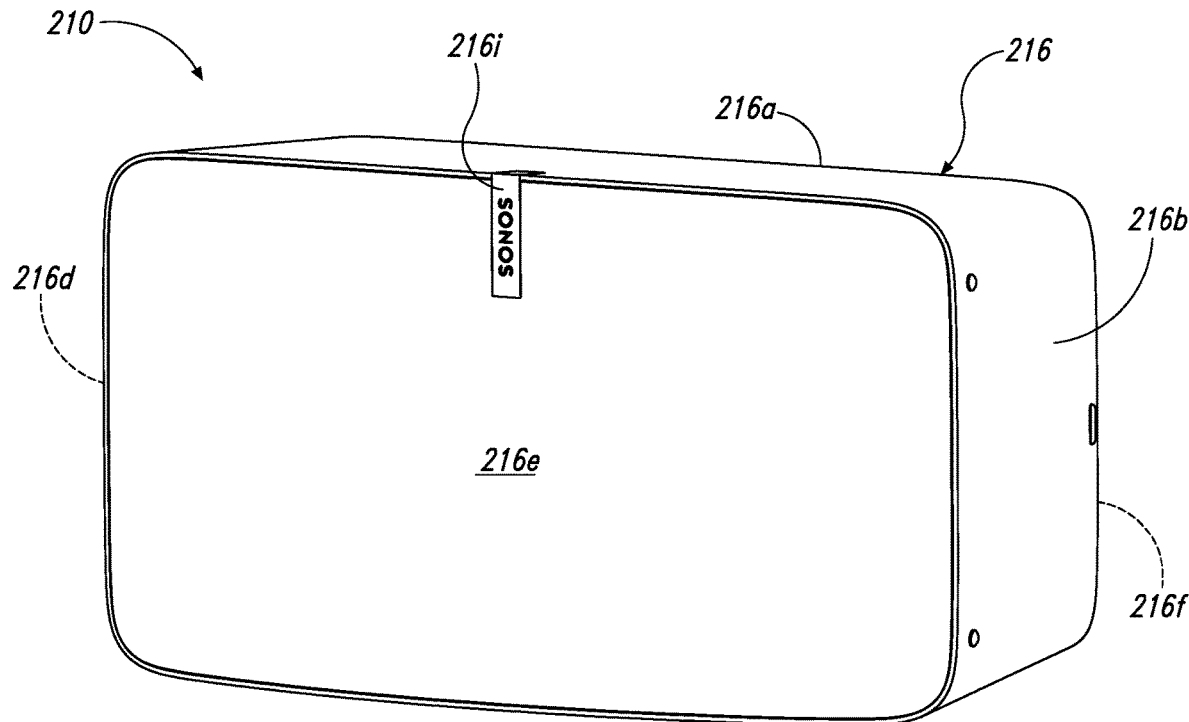
FIG. 2A shows a front isometric view of a playback device configured in accordance with aspects of the disclosed technology.
Figure 2B:
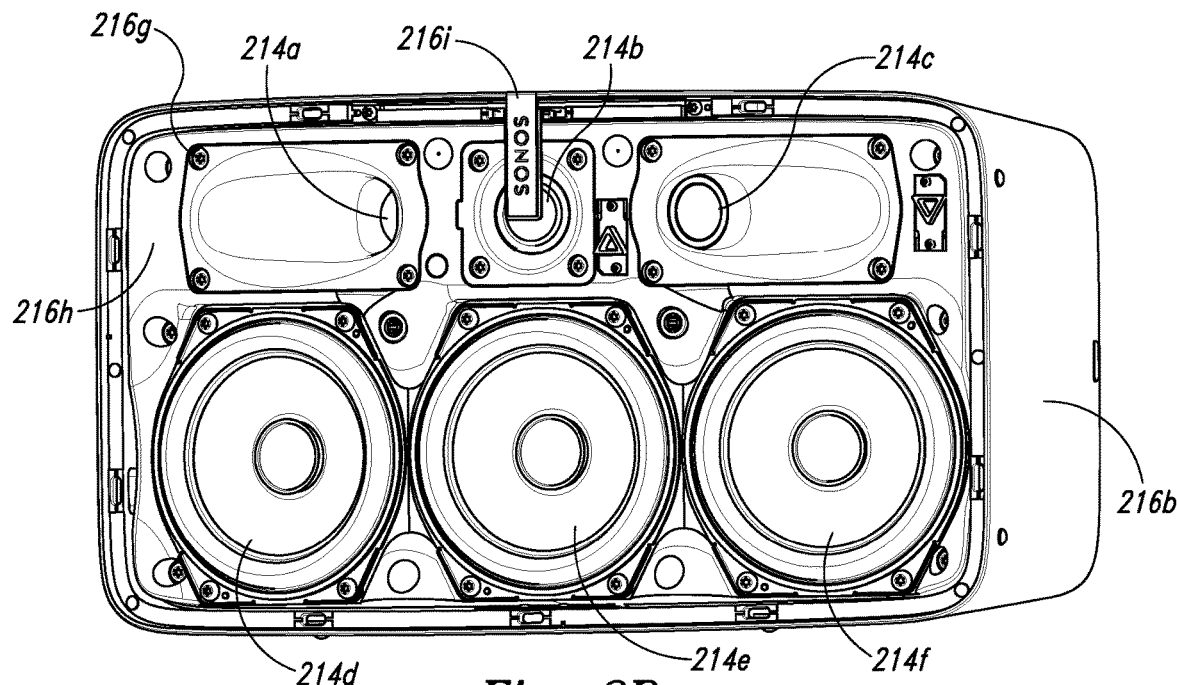
FIG. 2B shows a front isometric view of the playback device of FIG. 3A without a grille.
Figure 2C:
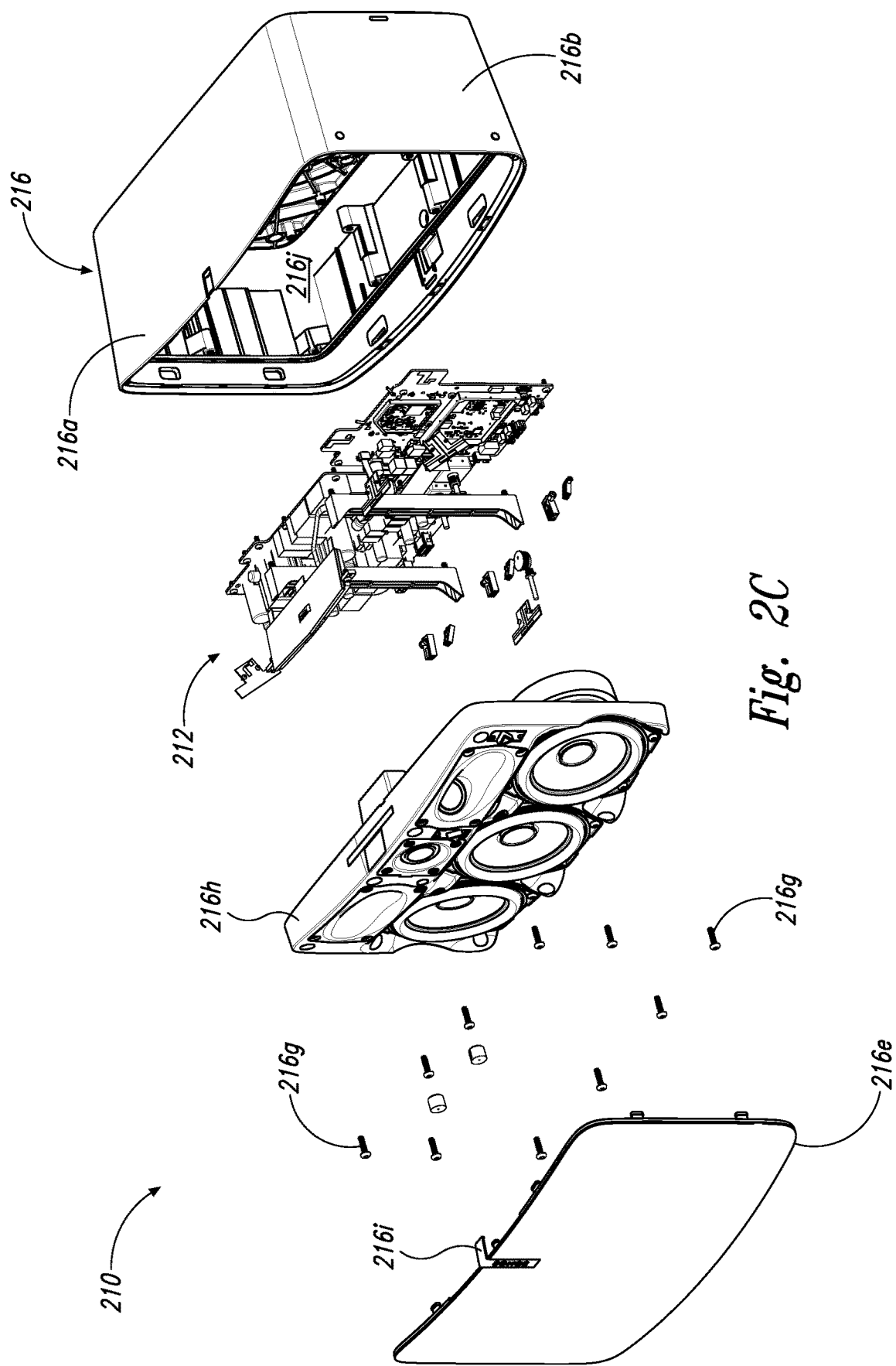
FIG. 2C shows an exploded view of the playback device of FIG. 2A.

FIG. 2A is a front isometric view of a playback device 210 configured in accordance with aspects of the disclosed technology. FIG. 2B is a front isometric view of the playback device 210 without a grille 216e. FIG. 2C is an exploded view of the playback device 210. Referring to FIGS. 2A-2C together, the playback device 210 comprises a housing 216 that includes an upper portion 216a, a right or first side portion 216b, a lower portion 216c, a left or second side portion 216d, the grille 216e, and a rear portion 216f. A plurality of fasteners 216g (e.g., one or more screws, rivets, clips) attaches a frame 216h to the housing 216. A cavity 216j (FIG. 2C) in the housing 216 is configured to receive the frame 216h and electronics 212. The frame 216h is configured to carry a plurality of transducers 214 (identified individually in FIG. 2B as transducers 214a-f). The electronics 212 (e.g., the electronics 112 of FIG. 1C) is configured to receive audio content from an audio source and send electrical signals corresponding to the audio content to the transducers 214 for playback.

The transducers 214 are configured to receive the electrical signals from the electronics 112, and further configured to convert the received electrical signals into audible sound during playback. For instance, the transducers 214a-c (e.g., tweeters) can be configured to output high frequency sound (e.g., sound waves having a frequency greater than about 2 kHz). The transducers 214d-f (e.g., mid-woofers, woofers, midrange speakers) can be configured output sound at frequencies lower than the transducers 214a-c (e.g., sound waves having a frequency lower than about 2 kHz). In some embodiments, the playback device 210 includes a number of transducers different than those illustrated in FIGS. 2A-2C. For example, as described in further detail below with respect to FIGS. 3A-3C, the playback device 210 can include fewer than six transducers (e.g., one, two, three). In other embodiments, however, the playback device 210 includes more than six transducers (e.g., nine, ten). Moreover, in some embodiments, all or a portion of the transducers 214 are configured to operate as a phased array to desirably adjust (e.g., narrow or widen) a radiation pattern of the transducers 214, thereby altering a user's perception of the sound emitted from the playback device 210.

In the illustrated embodiment of FIGS. 2A-2C, a filter 216i is axially aligned with the transducer 214b. The filter 216i can be configured to desirably attenuate a predetermined range of frequencies that the transducer 214b outputs to improve sound quality and a perceived sound stage output collectively by the transducers 214. In some embodiments, however, the playback device 210 omits the filter 216i. In other embodiments, the playback device 210 includes one or more additional filters aligned with the transducers 214b and/or at least another of the transducers 214.

Figure 3A:
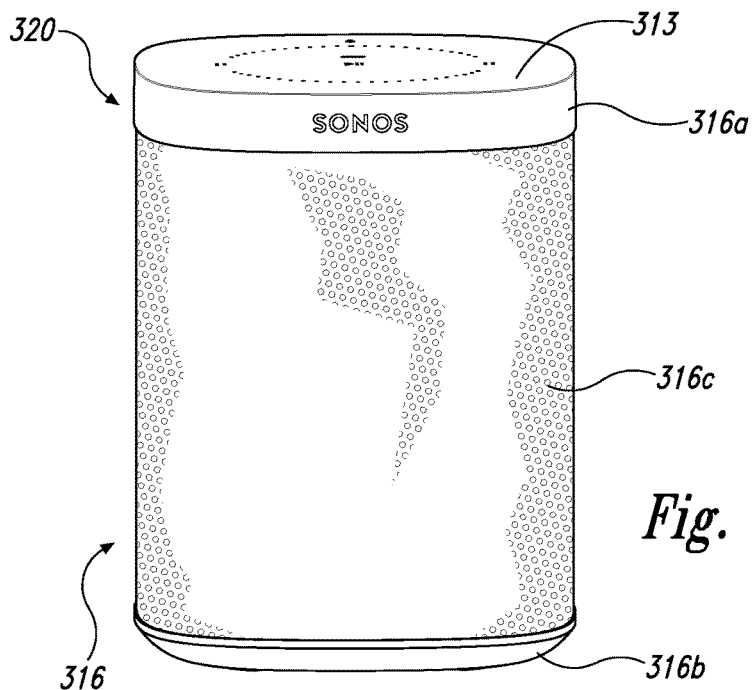
FIG. 3A shows a front view of a network microphone device configured in accordance with aspects of the disclosed technology.
Figure 3B:
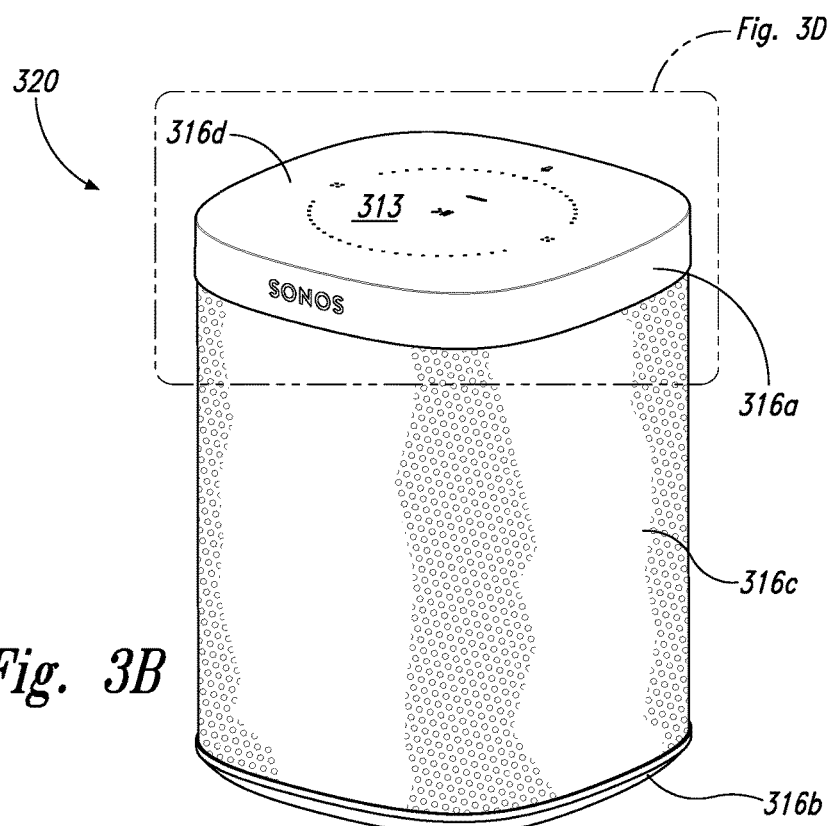
FIG. 3B shows a side isometric view of the network microphone device of FIG. 3A.
Figure 3C:
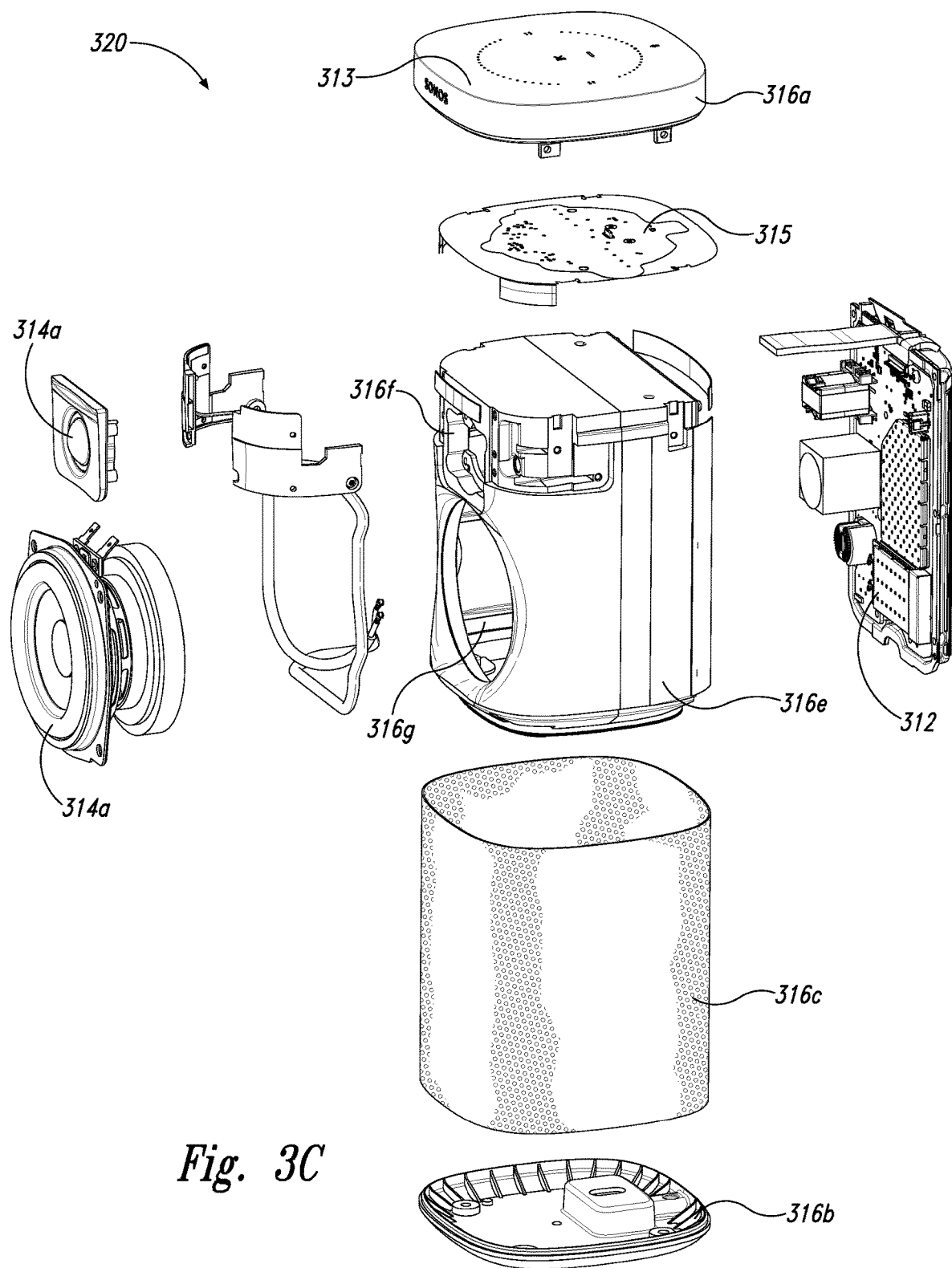
FIG. 3C shows an exploded view of the network microphone device of FIGS. 3A and 3B.
Figure 3D:
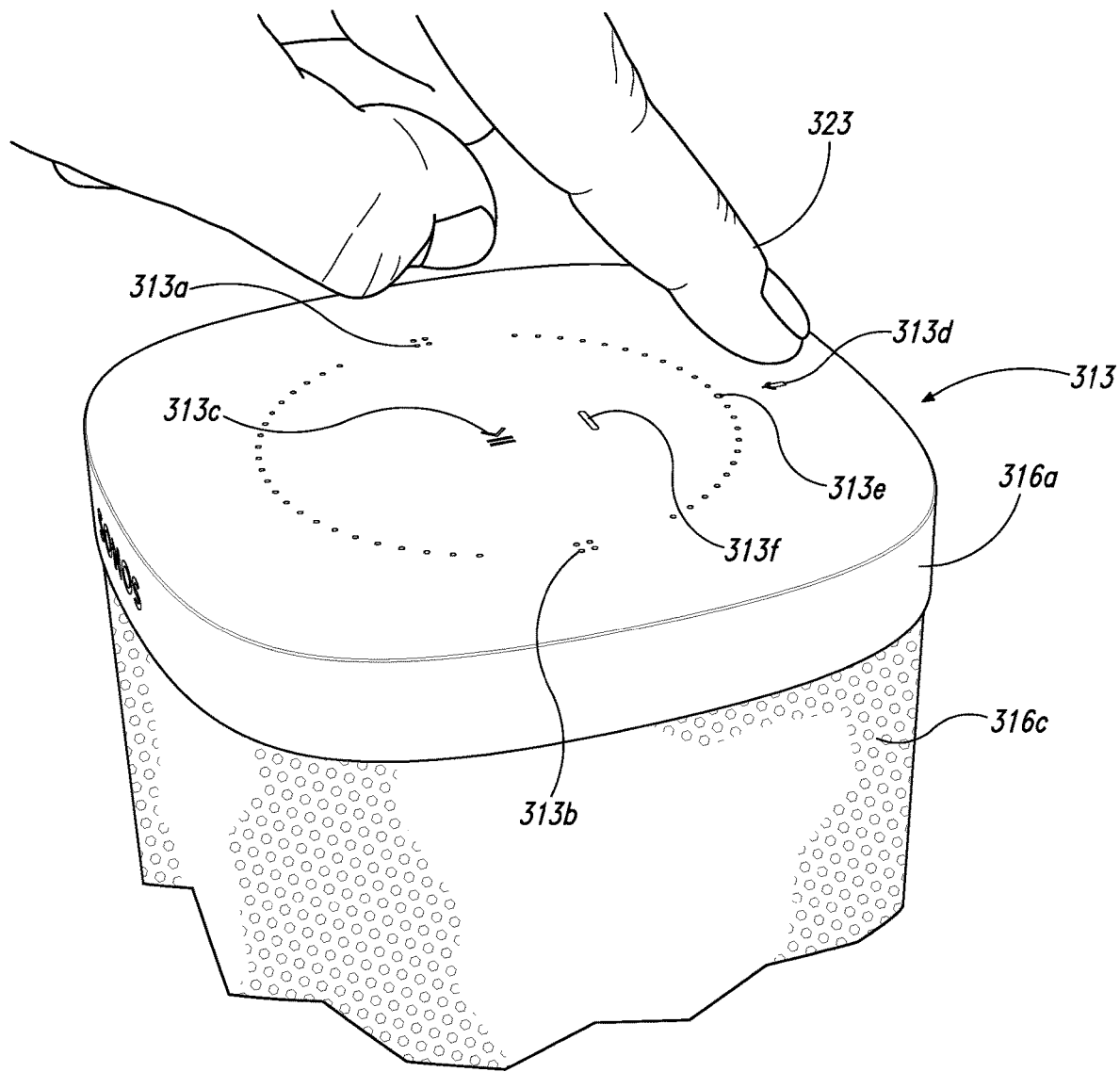
FIG. 3D shows an enlarged view of a portion of FIG. 3B.

FIGS. 3A and 3B are front and right isometric side views, respectively, of an NMD 320 configured in accordance with embodiments of the disclosed technology. FIG. 3C is an exploded view of the NMD 320. FIG. 3D is an enlarged view of a portion of FIG. 3B including a user interface 313 of the NMD 320. Referring first to FIGS. 3A-3C, the NMD 320 includes a housing 316 comprising an upper portion 316a, a lower portion 316b and an intermediate portion 316c (e.g., a grille). A plurality of ports, holes or apertures 316d in the upper portion 316a allow sound to pass through to one or more microphones 315 (FIG. 3C) positioned within the housing 316. The one or more microphones 316 are configured to received sound via the apertures 316d and produce electrical signals based on the received sound. In the illustrated embodiment, a frame 316e (FIG. 3C) of the housing 316 surrounds cavities 316f and 316g configured to house, respectively, a first transducer 314a (e.g., a tweeter) and a second transducer 314b (e.g., a mid-woofer, a midrange speaker, a woofer). In other embodiments, however, the NMD 320 includes a single transducer, or more than two (e.g., two, five, six) transducers. In certain embodiments, the NMD 320 omits the transducers 314a and 314b altogether.

Electronics 312 (FIG. 3C) includes components configured to drive the transducers 314a and 314b, and further configured to analyze audio information corresponding to the electrical signals produced by the one or more microphones 315. In some embodiments, for example, the electronics 312 comprises many or all of the components of the electronics 112 described above with respect to FIG. 1C. In certain embodiments, the electronics 312 includes components described above with respect to FIG. 1F such as, for example, the one or more processors 112a, the memory 112b, the software components 112c, the network interface 112d, etc. In some embodiments, the electronics 312 includes additional suitable components (e.g., proximity or other sensors).

Referring to FIG. 3D, the user interface 313 includes a plurality of control surfaces (e.g., buttons, knobs, capacitive surfaces) including a first control surface 313a (e.g., a previous control), a second control surface 313b (e.g., a next control), and a third control surface 313c (e.g., a play and/or pause control). A fourth control surface 313d is configured to receive touch input corresponding to activation and deactivation of the one or microphones 315. A first indicator 313e (e.g., one or more light emitting diodes (LEDs) or another suitable illuminator) can be configured to illuminate only when the one or more microphones 315 are activated. A second indicator 313f (e.g., one or more LEDs) can be configured to remain solid during normal operation and to blink or otherwise change from solid to indicate a detection of voice activity. In some embodiments, the user interface 313 includes additional or fewer control surfaces and illuminators. In one embodiment, for example, the user interface 313 includes the first indicator 313e, omitting the second indicator 313f. Moreover, in certain embodiments, the NMD 320 comprises a playback device and a control device, and the user interface 313 comprises the user interface of the control device.

Referring to FIGS. 3A-3D together, the NMD 320 is configured to receive voice commands from one or more adjacent users via the one or more microphones 315. As described above with respect to FIG. 1B, the one or more microphones 315 can acquire, capture, or record sound in a vicinity (e.g., a region within 10 m or less of the NMD 320) and transmit electrical signals corresponding to the recorded sound to the electronics 312. The electronics 312 can process the electrical signals and can analyze the resulting audio data to determine a presence of one or more voice commands (e.g., one or more activation words). In some embodiments, for example, after detection of one or more suitable voice commands, the NMD 320 is configured to transmit a portion of the recorded audio data to another device and/or a remote server (e.g., one or more of the computing devices 106 of FIG. 1B) for further analysis. The remote server can analyze the audio data, determine an appropriate action based on the voice command, and transmit a message to the NMD 320 to perform the appropriate action. For instance, a user may speak "Sonos, play Michael Jackson." The NMD 320 can, via the one or more microphones 315, record the user's voice utterance, determine the presence of a voice command, and transmit the audio data having the voice command to a remote server (e.g., one or more of the remote computing devices 106 of FIG. 1B, one or more servers of a VAS and/or another suitable service). The remote server can analyze the audio data and determine an action corresponding to the command. The remote server can then transmit a command to the NMD 320 to perform the determined action (e.g., play back audio content related to Michael Jackson). The NMD 320 can receive the command and play back the audio content related to Michael Jackson from a media content source. As described above with respect to FIG. 1B, suitable content sources can include a device or storage communicatively coupled to the NMD 320 via a LAN (e.g., the network 104 of FIG. 1B), a remote server (e.g., one or more of the remote computing devices 106 of FIG. 1B), etc. In certain embodiments, however, the NMD 320 determines and/or performs one or more actions corresponding to the one or more voice commands without intervention or involvement of an external device, computer, or server.

Figure 3E:
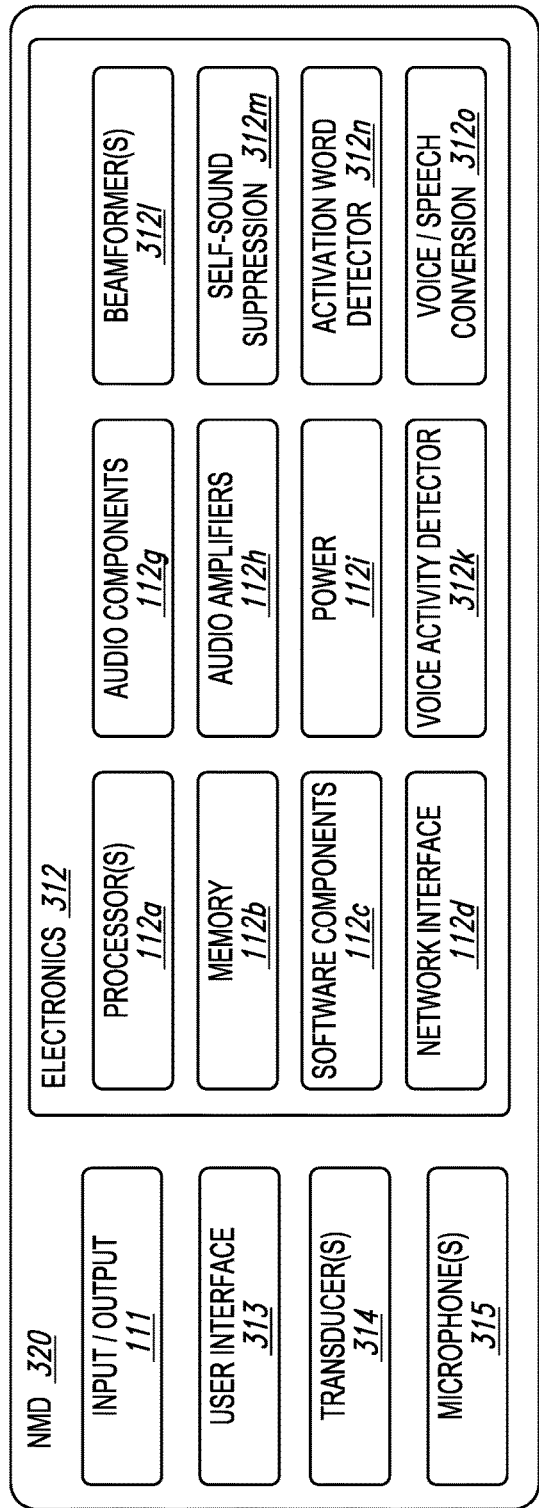
FIG. 3E shows a block diagram of the network microphone device of FIGS. 3A-3D

FIG. 3E is a functional block diagram showing additional features of the NMD 320 in accordance with aspects of the disclosure. The NMD 320 includes components configured to facilitate voice command capture including voice activity detector component(s) 312$k$, beam former components 312$l$, acoustic echo cancellation (AEC) and/or self-sound suppression components 312$m$, activation word detector components 312$n$, and voice/speech conversion components 312$o$ (e.g., voice-to-text and text-to-voice). In the illustrated embodiment of FIG. 3E, the foregoing components 312$k$-312$o$ are shown as separate components. In some embodiments, however, one or more of the components 312$k$-312$o$ are subcomponents of the processors 112$a$.

The beamforming and self-sound suppression components 312$l$ and 312$m$ are configured to detect an audio signal and determine aspects of voice input represented in the detected audio signal, such as the direction, amplitude, frequency spectrum, etc. The voice activity detector activity components 312$k$ are operably coupled with the beamforming and AEC components 312$l$ and 312$m$ and are configured to determine a direction and/or directions from which voice activity is likely to have occurred in the detected audio signal. Potential speech directions can be identified by monitoring metrics which distinguish speech from other sounds. Such metrics can include, for example, energy within the speech band relative to background noise and entropy within the speech band, which is measure of spectral structure. As those of ordinary skill in the art will appreciate, speech typically has a lower entropy than most common background noise.

The activation word detector components 312$n$ are configured to monitor and analyze received audio to determine if any activation words (e.g., wake words) are present in the received audio. The activation word detector components 312$n$ may analyze the received audio using an activation word detection algorithm. If the activation word detector 312$n$ detects an activation word, the NMD 320 may process voice input contained in the received audio. Example activation word detection algorithms accept audio as input and provide an indication of whether an activation word is present in the audio. Many first- and third-party activation word detection algorithms are known and commercially available. For instance, operators of a voice service may make their algorithm available for use in third-party devices. Alternatively, an algorithm may be trained to detect certain activation words. In some embodiments, the activation word detector 312$n$ runs multiple activation word detection algorithms on the received audio simultaneously (or substantially simultaneously). As noted above, different voice services (e.g. AMAZON's ALEXA®, APPLE's SIRI®, or MICROSOFT's CORTANA®) can each use a different activation word for invoking their respective voice service. To support multiple services, the activation word detector 312$n$ may run the received audio through the activation word detection algorithm for each supported voice service in parallel.

The speech/text conversion components 312$o$ may facilitate processing by converting speech in the voice input to text. In some embodiments, the electronics 312 can include voice recognition software that is trained to a particular user or a particular set of users associated with a household. Such voice recognition software may implement voice-processing algorithms that are tuned to specific voice profile(s). Tuning to specific voice profiles may require less computationally intensive algorithms than traditional voice activity services, which typically sample from a broad base of users and diverse requests that are not targeted to media playback systems.

Figure 3F:
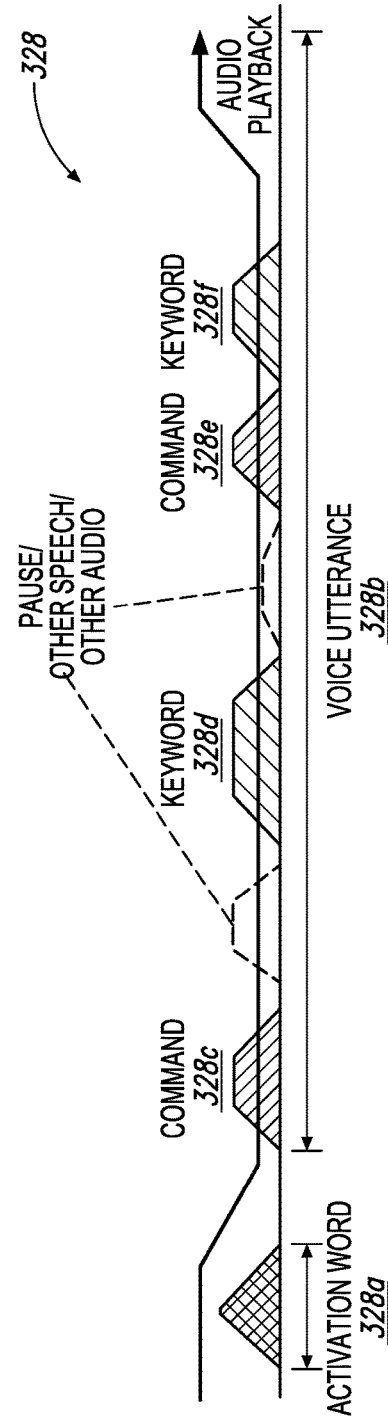
FIG. 3F shows a schematic diagram of an example voice input.

FIG. 3F is a schematic diagram of an example voice input 328 captured by the NMD 320 in accordance with aspects of the disclosure. The voice input 328 can include a activation word portion 328$a$ and a voice utterance portion 328$b$. In some embodiments, the activation word 557$a$ can be a known activation word, such as "Alexa," which is associated with AMAZON's ALEXA®. In other embodiments, however, the voice input 328 may not include a activation word. In some embodiments, a network microphone device may output an audible and/or visible response upon detection of the activation word portion 328$a$. In addition or alternately, an NMB may output an audible and/or visible response after processing a voice input and/or a series of voice inputs.

The voice utterance portion 328$b$ may include, for example, one or more spoken commands (identified individually as a first command 328$c$ and a second command 328$e$) and one or more spoken keywords (identified individually as a first keyword 328$d$ and a second keyword 328$f$). In one example, the first command 328$c$ can be a command to play music, such as a specific song, album, playlist, etc. In this example, the keywords may be one or words identifying one or more zones in which the music is to be played, such as the Living Room and the Dining Room shown in FIG. 1A. In some examples, the voice utterance portion 328$b$ can include other information, such as detected pauses (e.g., periods of non-speech) between words spoken by a user, as shown in FIG. 3F. The pauses may demarcate the locations of separate commands, keywords, or other information spoke by the user within the voice utterance portion 328$b$.

In some embodiments, the media playback system 100 is configured to temporarily reduce the volume of audio content that it is playing while detecting the activation word portion 557$a$. The media playback system 100 may restore the volume after processing the voice input 328, as shown in FIG. 3F. Such a process can be referred to as ducking, examples of which are disclosed in U.S. patent application Ser. No. 15/438,749, incorporated by reference herein in its entirety.

Figure 4A:
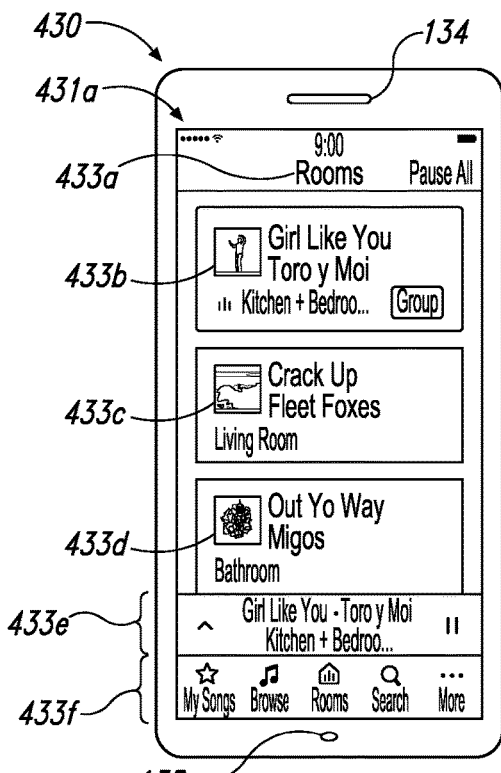
FIGS. 4A-4D show schematic diagrams of a control device in various stages of operation in accordance with aspects of the disclosed technology.
Figure 4B:
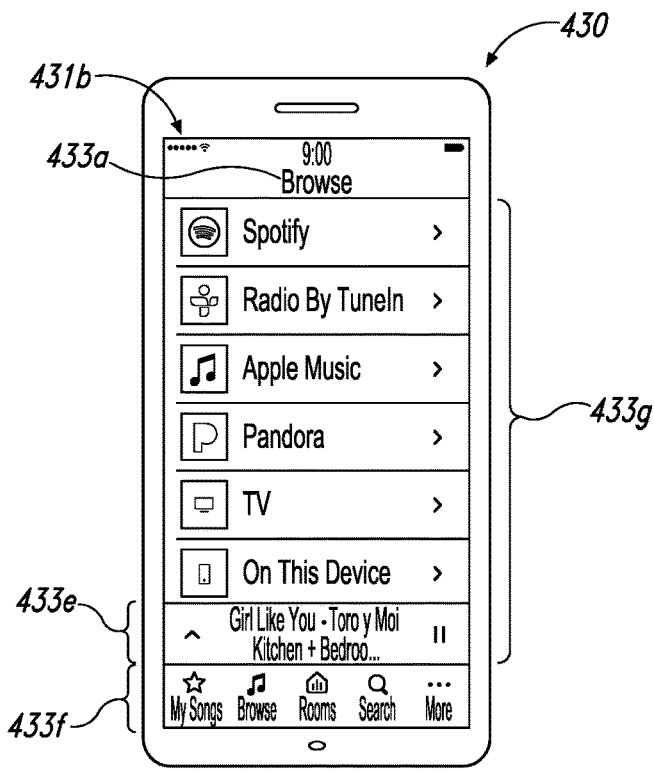
Figure 4C:
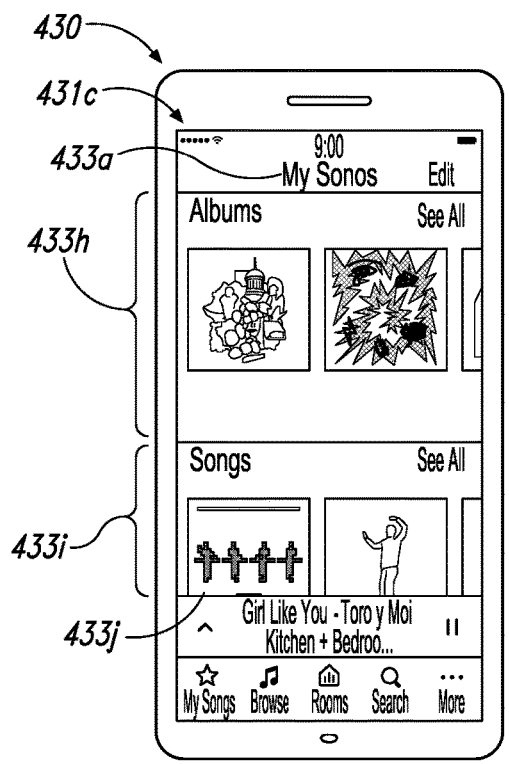
Figure 4D:
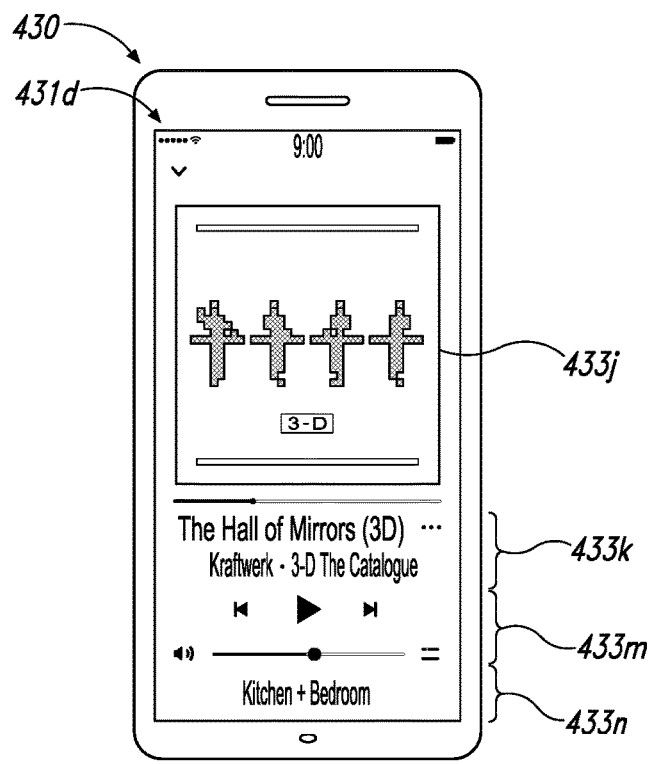

FIGS. 4A-4D are schematic diagrams of a control device 430 (e.g., the control device 130$a$ of FIG. 1H, a smartphone, a tablet, a dedicated control device, an IoT device, and/or another suitable device) showing corresponding user interface displays in various states of operation. A first user interface display 431a (FIG. 4A) includes a display name 433a (i.e., "Rooms"). A selected group region 433b displays audio content information (e.g., artist name, track name, album art) of audio content played back in the selected group and/or zone. Group regions 433c and 433d display corresponding group and/or zone name, and audio content information audio content played back or next in a playback queue of the respective group or zone. An audio content region 433e includes information related to audio content in the selected group and/or zone (i.e., the group and/or zone indicated in the selected group region 433b). A lower display region 433f is configured to receive touch input to display one or more other user interface displays. For example, if a user selects "Browse" in the lower display region 433f, the control device 430 can be configured to output a second user interface display 431b (FIG. 4B) comprising a plurality of music services 433g (e.g., Spotify, Radio by Tunein, Apple Music, Pandora, Amazon, TV, local music, line-in) through which the user can browse and from which the user can select media content for play back via one or more playback devices (e.g., one of the playback devices 110 of FIG. 1A). Alternatively, if the user selects "My Sonos" in the lower display region 433f, the control device 430 can be configured to output a third user interface display 431c (FIG. 4C). A first media content region 433h can include graphical representations (e.g., album art) corresponding to individual albums, stations, or playlists. A second media content region 433i can include graphical representations (e.g., album art) corresponding to individual songs, tracks, or other media content. If the user selections a graphical representation 433j (FIG. 4C), the control device 430 can be configured to begin play back of audio content corresponding to the graphical representation 433j and output a fourth user interface display 431d fourth user interface display 431d includes an enlarged version of the graphical representation 433j, media content information 433k (e.g., track name, artist, album), transport controls 433m (e.g., play, previous, next, pause, volume), and indication 433n of the currently selected group and/or zone name.

Figure 5:
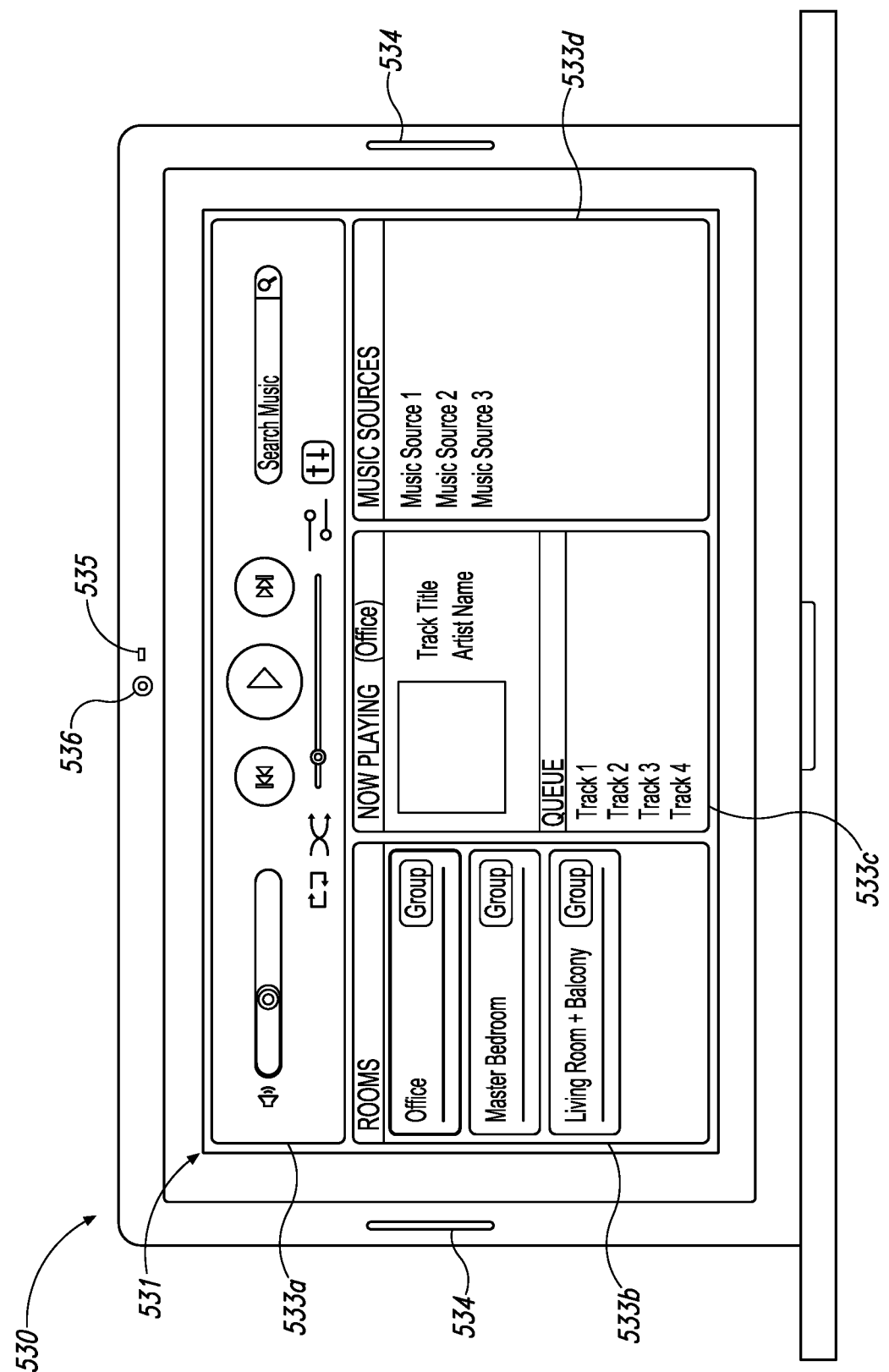
FIG. 5 shows front view of a control device.

FIG. 5 is a schematic diagram of a control device 530 (e.g., a laptop computer, a desktop computer). The control device 530 includes transducers 534, a microphone 535, and a camera 536. A user interface 531 includes a transport control region 533a, a playback status region 533b, a playback zone region 533c, a playback queue region 533d, and a media content source region 533e. The transport control region comprises one or more controls for controlling media playback including, for example, volume, previous, play/pause, next, repeat, shuffle, track position, crossfade, equalization, etc. The audio content source region 533e includes a listing of one or more media content sources from which a user can select media items for play back and/or adding to a playback queue.

The playback zone region 533b can include representations of playback zones within the media playback system 100 (FIGS. 1A and 1B). In some embodiments, the graphical representations of playback zones may be selectable to bring up additional selectable icons to manage or configure the playback zones in the media playback system, such as a creation of bonded zones, creation of zone groups, separation of zone groups, renaming of zone groups, etc. In the illustrated embodiment, a "group" icon is provided within each of the graphical representations of playback zones. The "group" icon provided within a graphical representation of a particular zone may be selectable to bring up options to select one or more other zones in the media playback system to be grouped with the particular zone. Once grouped, playback devices in the zones that have been grouped with the particular zone can be configured to play audio content in synchrony with the playback device(s) in the particular zone. Analogously, a "group" icon may be provided within a graphical representation of a zone group. In the illustrated embodiment, the "group" icon may be selectable to bring up options to deselect one or more zones in the zone group to be removed from the zone group. In some embodiments, the control device 530 includes other interactions and implementations for grouping and ungrouping zones via the user interface 531. In certain embodiments, the representations of playback zones in the playback zone region 533b can be dynamically updated as a playback zone or zone group configurations are modified.

The playback status region 533c includes graphical representations of audio content that is presently being played, previously played, or scheduled to play next in the selected playback zone or zone group. The selected playback zone or zone group may be visually distinguished on the user interface, such as within the playback zone region 533b and/or the playback queue region 533d. The graphical representations may include track title, artist name, album name, album year, track length, and other relevant information that may be useful for the user to know when controlling the media playback system 100 via the user interface 531.

The playback queue region 533d includes graphical representations of audio content in a playback queue associated with the selected playback zone or zone group. In some embodiments, each playback zone or zone group may be associated with a playback queue containing information corresponding to zero or more audio items for playback by the playback zone or zone group. For instance, each audio item in the playback queue may comprise a uniform resource identifier (URI), a uniform resource locator (URL) or some other identifier that may be used by a playback device in the playback zone or zone group to find and/or retrieve the audio item from a local audio content source or a networked audio content source, possibly for playback by the playback device. In some embodiments, for example, a playlist can be added to a playback queue, in which information corresponding to each audio item in the playlist may be added to the playback queue. In some embodiments, audio items in a playback queue may be saved as a playlist. In certain embodiments, a playback queue may be empty, or populated but "not in use" when the playback zone or zone group is playing continuously streaming audio content, such as Internet radio that may continue to play until otherwise stopped, rather than discrete audio items that have playback durations. In some embodiments, a playback queue can include Internet radio and/or other streaming audio content items and be "in use" when the playback zone or zone group is playing those items.

When playback zones or zone groups are "grouped" or "ungrouped," playback queues associated with the affected playback zones or zone groups may be cleared or re-associated. For example, if a first playback zone including a first playback queue is grouped with a second playback zone including a second playback queue, the established zone group may have an associated playback queue that is initially empty, that contains audio items from the first playback queue (such as if the second playback zone was added to the first playback zone), that contains audio items from the second playback queue (such as if the first playback zone was added to the second playback zone), or a combination of audio items from both the first and second playback queues. Subsequently, if the established zone group is ungrouped, the resulting first playback zone may be re-associated with the previous first playback queue, or be associated with a new playback queue that is empty or contains audio items from the playback queue associated with the established zone group before the established zone group was ungrouped. Similarly, the resulting second playback zone may be re-associated with the previous second playback queue, or be associated with a new playback queue that is empty, or contains audio items from the playback queue associated with the established zone group before the established zone group was ungrouped.

Figure 6:
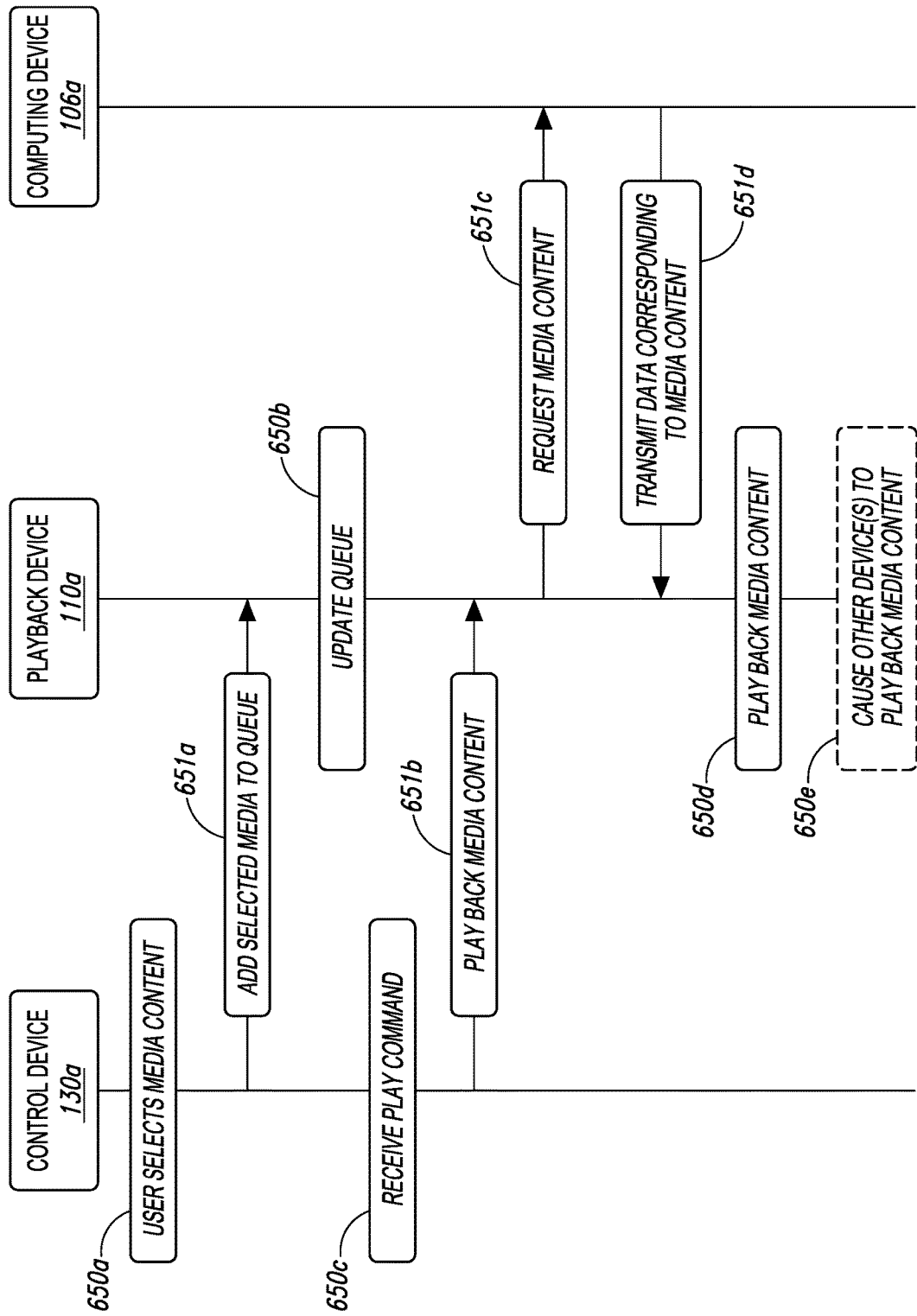
FIG. 6 shows a message flow diagram of a media playback system.

FIG. 6 is a message flow diagram illustrating data exchanges between devices of the media playback system 100 (FIGS. 1A-1M).

At step 650a, the media playback system 100 receives an indication of selected media content (e.g., one or more songs, albums, playlists, podcasts, videos, stations) via the control device 130a. The selected media content can comprise, for example, media items stored locally on or more devices (e.g., the audio source 105 of FIG. 1C) connected to the media playback system and/or media items stored on one or more media service servers (one or more of the remote computing devices 106 of FIG. 1B). In response to receiving the indication of the selected media content, the control device 130a transmits a message 651a to the playback device 110a (FIGS. 1A-1C) to add the selected media content to a playback queue on the playback device 110a.

At step 650b, the playback device 110a receives the message 651a and adds the selected media content to the playback queue for play back.

At step 650c, the control device 130a receives input corresponding to a command to play back the selected media content. In response to receiving the input corresponding to the command to play back the selected media content, the control device 130a transmits a message 651b to the playback device 110a causing the playback device 110a to play back the selected media content. In response to receiving the message 651b, the playback device 110a transmits a message 651c to the first computing device 106a requesting the selected media content. The first computing device 106a, in response to receiving the message 651c, transmits a message 651d comprising data (e.g., audio data, video data, a URL, a URI) corresponding to the requested media content.

At step 650d, the playback device 110a receives the message 651d with the data corresponding to the requested media content and plays back the associated media content.

At step 650e, the playback device 110a optionally causes one or more other devices to play back the selected media content. In one example, the playback device 110a is one of a bonded zone of two or more players (FIG. 1M). The playback device 110a can receive the selected media content and transmit all or a portion of the media content to other devices in the bonded zone. In another example, the playback device 110a is a coordinator of a group and is configured to transmit and receive timing information from one or more other devices in the group. The other one or more devices in the group can receive the selected media content from the first computing device 106a, and begin playback of the selected media content in response to a message from the playback device 110a such that all of the devices in the group play back the selected media content in synchrony.

IV. Overview of Example Embodiments

As described above, multiple communication and/or operating schemes may be employed to support multiple difference classes of devices. For example, a first scheme may be employed for operations and/or communications between devices of a first class and a second scheme may be employed for operations and/or communications between devices of a first class and devices of a second, different class. As a result, the particular scheme employed to interact with a particular class of devices may be tailored to the specific to the capabilities of devices belonging to the particular class.

Figure 7:
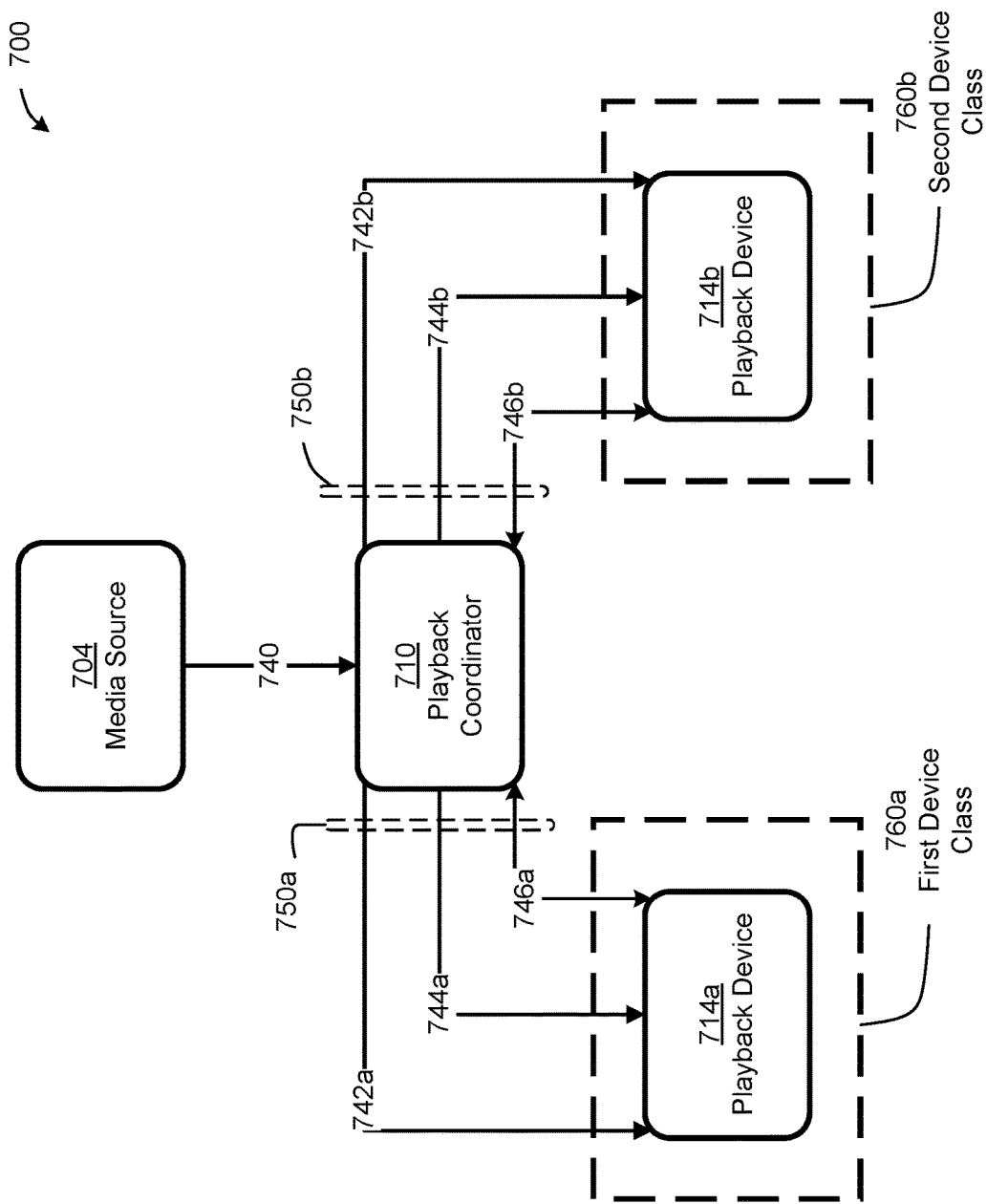
FIG. 7 shows an example configuration of a media playback group configured for synchronization.

FIG. 7 shows an example configuration of a media playback group 700 configured for synchronous playback of media across playback devices across multiple different classes. As shown, the playback group 700 comprises a playback coordinator 710 (e.g., a playback device operating in a group coordinator mode, which may be a device of one of the first device class 760a or the second device class 760b), a first playback device 714a (e.g., operating in a group member mode) belonging to a first device class 760a, and a second playback device 714b (e.g., operating in a group member mode) belonging to a second device class 760b. Although playback group 700 shows only two playback devices 714a and 714b being coordinated by the playback coordinator 710, the playback coordinator 710 may coordinator any number of playback devices (e.g., one, three, four, five, etc.). Further, any number of the playback devices being coordinated by the playback coordinator 710 may belong to the first device class 760a or the second device class 760b. The playback group 700 may receive media information 740 for playback from a media source 704. The media source 704 may comprise any of the media sources disclosed herein, including but not limited to streaming media sources available via the Internet or any other source of media content now known or later developed. The media information 740 may comprise any of the media content disclosed herein, including but not limited to streaming media content available via the Internet from streaming media sources.

In operation, the playback coordinator 710 (i) receives media information 740 from the media source 702 via a communications link between the media source 702 and the playback coordinator 710, (ii) provides a first data stream 750a (e.g., comprising media information 742a) to the playback device 714a for playback of media content based on the media information 742a, and (iii) provides a second data stream 750b (e.g., comprising media information 742b) to the playback device 714b for playback of media content based on the media information 742b (e.g., in synchrony with playback of the media content based on the media information 742a by the playback device 714a). Additionally (or alternatively), the playback coordinator 710 may playback media content based on media information 742a and/or 742b (e.g., in synchrony with the playback devices 714a and/or 714b).

In some instances, the playback coordinator 710 receives a stream of packets comprising the media information 740 (which may or may not be encoded) from the media source 702 and extracts the media information 740 from the incoming stream on a packet-by-packet basis. That is, when the playback coordinator 710 receives a first packet comprising the media information 740 from the source 702, the playback coordinator 710 extracts the portion(s) of media information 740 contained within that packet. The playback coordinator 710 continues to extract the media information 740 from the packets as they arrive (or substantially as they arrive) on a packet-by-packet basis (or frame-by-frame or cell-by-cell, depending on how the media information 740 is packaged).

While the playback coordinator 710 continues to receive the incoming stream of data comprising the media information 740 (e.g., a media stream) and extract the media information 740 from the incoming stream, the playback coordinator 710 generates and transmits a first data stream 750a (e.g., a first outgoing stream) comprising portions of extracted media information 742a to at least the playback device 714a (and perhaps also to additional playback devices in the first device class 760a (not shown)) and a second data stream 750b (e.g., a second outgoing stream) comprising portions of the extracted media information 742b to at least the playback device 714b (and perhaps also to additional playback devices in the second device class 760b (not shown)). It should be appreciated that each of these data streams (e.g., the media stream, the first data stream 750a, and/or the second data stream 750b) may be communicated via any of a variety of communication interfaces over any of a variety of data networks (e.g., BLUETOOTH networks, LANs such as WLANs, etc.). For example, the playback coordinator 710 may transmit both of the first and second data streams 750a and 750b, respectively, over at least one common data network (e.g., via a common LAN such as a common WLAN (e.g., a WIFI network)). In another example, the playback coordinator 710 may transmit the first and second data streams 750a and 750b, respectively, over different data networks (e.g., the first data stream 750a may be communicated over a LAN and the second data stream 750b may be communicated over a BLUETOOTH network).

In operation, one or both of the data streams 750a and 750b comprises (i) portions of the media information extracted from the incoming stream and (ii) playback timing information, wherein the playback timing information comprises playback timing for the portions of the media information extracted from the incoming stream. In some embodiments, one or both of the data streams 750a and 750b may additionally comprise clock timing information. In some embodiments, however, the playback coordinator 710 may transmit clock timing information to the playback devices 714a and/or 714b separately from one or both of the data streams 750a and 750b.

In some instances, the first and second data streams 750a and 750b may be different in at least one respect. For example, the media information in the first data stream 750a may be decoded (e.g., uncompressed) (e.g., to simplify playback by the playback device 714a) while the media information in the second data stream may be left encoded in the same format received from the media source 702 (e.g., to reduce network bandwidth requirements for transmission of the media information). In another example, the media information in the first data stream 750a may be encoded in a first format that is different from the format received from the media source (e.g., to recode the media in a format that is decodable by the playback device 714a) while the media information in the second data stream may be left encoded in the same format received from the media source 702. Additionally (or alternatively), the way in which clock timing information and/or playback timing information is communicated may be different between the first and second data streams 750a and 750b.

In particular, in addition to the portions of media information 742a and 742b, the playback coordinator 710 also transmits playback timing information 744a and 744b for the respective portions of the media information 742 and clock timing information 746a and 746b to the respective playback devices 714a and 714b (and perhaps additional playback devices (not shown)). In some instances, the playback coordinator 710 may use one or both of the playback timing information 744a and/or 714b and one or both of the clock timing information 746a and 746b to play media content based on the media information 742 in synchrony with at least one of the first and second playback devices 714a and 714b as described herein.

In example configuration 700, and in connection with generating the first and second data streams 750a and 750b, the playback coordinator 710 uses a common time reference (e.g., clock timing of a clock of the playback coordinator 710, a separate clock reference that is available to the playback coordinator 710 via one or more data networks such as a clock reference from an access point or another device, etc.) to generate one or more of: (1) the playback timing information 744a for the media information 742a; (2) the playback timing information 744b for the media information 742b; (3) clock timing information 746a; and/or (4) clock timing information 746b.

In some embodiments, the playback coordinator 710 generates the playback timing information 744a and/or 744b by adding a "timing advance" to a current clock time of the reference clock (e.g., a local reference clock) that the playback coordinator 710 uses for generating the playback timing information 744a and/or 744b. In some embodiments, the playback timing for a frame or packet of media information 742a and/or 742a corresponds (directly or indirectly) to a future time, relative to a reference clock time, that the portion(s) media information 742a and/or 742b in the packet (or frame) is to be played.

In some embodiments, the timing advance that the playback coordinator 710 adds to the clock timing reference to generate a future time for the playback timing information 744a and/or 744b is based on an amount of time that is greater than or equal to the sum of (i) the network transit time required for packets transmitted from the playback coordinator 710 to arrive at the playback devices 714a and/or 714b and (ii) the amount of time required for the playback devices 714a and/or 714b to process received packets for playback.

In some embodiments, the playback coordinator 710 determines the timing advance by sending one or more test packets to the playback devices 714a and/or 714b and receiving test response packets back from the playback devices 714a and/or 714b in response to the test packets. In some embodiments, the playback coordinator 710 and the playback devices 714a and/or 714b can negotiate a timing advance via one or more test and response messages. For instance, the playback coordinator 710 sets a timing advance that is sufficient for the playback device (of playback devices 714a and 714b) having the longest total of network transit time and packet processing time.

In some embodiments, the timing advance is less than about 100 milliseconds. In some embodiments, the timing advance is less than about 50-80 milliseconds. And in still further embodiments, the timing advance is less than about 20 milliseconds. In some embodiments, the timing advance remains constant after being determined, or at least constant during the duration of a synchronous playback session or perhaps constant during the duration that the synchrony group is in existence or in a particular configuration (recall that synchrony groups can be formed, changed, disbanded, etc.).

In other embodiments, the playback coordinator 710 can change the timing advance in response to a request from a receiving playback device indicating that (i) a greater timing advance is required, e.g., because the receiving playback device is receiving packets comprising portions of media information 742a and/or 742b after the time for playing the portions (specified by the playback timing information 744a and/or 744*b*), or because the receiving playback device is receiving portions of media information 742*a* and/or 742*b* after other devices have already played the portions of media information, or (ii) a shorter timing advance would be sufficient, e.g., because the receiving device is buffering more packets comprising portions of media information than necessary to provide consistent, reliable playback.

After determining the playback timing information 744*a* and/or 744*b* for a packet, frame, and/or sample of the media information 742*a* and/or 742*b*, the playback coordinator 710 transmits the packet/frame/sample of media information 742*a* and/or 742*b* and the corresponding playback timing information 744*a* and/or 744*b* to the respective playback device 714*a* and 714*b*. Additionally (or alternatively), the playback coordinator 710 may also transmit clock timing information 746*a* and/or 746*b* to the playback devices 714*a* and/or 714*b*.

In some instances, one or both of the playback devices 714*a* and 714*b* uses the clock timing information 746*a* and/or 746*b* along with a local clock timing reference (e.g., a local clock of the respective playback device) to generate a "timing offset." Because the playback devices 714*a* and/or 714*b* uses the playback timing information 744*a* and/or 744*b* and the clock timing information 746*a* and/or 746*b* received from the playback coordinator 710 to play the media information 742*a* and/or 742*b*, the playback devices 744*a* and/or 7144*b*, in this instance, use remote playback timing and remote clock timing to play media content.

In some embodiments, one or more (or all) of the following steps occur in connection with playback device 714*a* and/or 714*b* generating the "timing offset" based the clock timing information 746*a* and/or 746*b* of the playback coordinator 710 and the respective playback device's own clock timing.

First, the playback coordinator 710 generates a clock timing indication (e.g., a timestamp or other indication) at time, t, and transmits that clock timing indication to a playback device (e.g., as part and/or all of the clock timing information 746*a* and/or 746*b*). Next, when the playback device receives the clock timing indication from the playback coordinator 710, the playback device determines the difference between a local clock at the playback device and the time, t, indicated in the clock timing indication. The playback device uses this determined "timing offset" to play back media content based on portions of media information (e.g., in synchrony with at least one other device such as another playback device and/or the playback coordinator 710).

In some embodiments, the playback coordinator 710 transmits the clock timing information 746*a* and/or 746 to the playback devices 714*a* and/or 714*b* at least once at the start of a synchronous playback session. In some embodiments, because clocks at the playback coordinator 710 and the playback devices 714*a* and 714*b* are susceptible to clock drift (e.g., frequency and/or phase drift), the playback coordinator 710 transmits the clock timing information 746*a* and/or 746*b* periodically or at least more than a few times during the course of a synchronous playback session. For example, the playback coordinator 710 may transmit the clock timing information 746*a* and/or 746*b* to the playback devices 714*a* and/or 714*b* every few milliseconds, every few tens of milliseconds, every few hundreds of milliseconds, every few seconds, every few minutes, and so on.

After transmitting at least some frames (or packets) comprising at least portions of the media information 742*a* and/or 742*b*, the first playback timing information 744*a* and/or 744*b*, and the clock timing information 746*a* and/or 746*b* to the playback devices 714*a* and/or 714*b*, the playback coordinator 710 and the playback devices 714*a* and/or 714*b* perform the following functions to play back media content in synchrony with each other (e.g., in scenarios where the playback coordinator 710 plays back media content in synchrony with one or both of playback devices 714*a* and/or 714*b*).

The playback coordinator 710 plays an individual frame (or packet) comprising portions of the media information 742*a* and/or 742*b* when the clock employed for generating the first playback timing information 744*a* and/or 744*b* reaches the time specified in the first playback timing information 744*a* and/or 744*b* for that individual frame (or packet) comprising the media information 742*a* and/or 742*b*. For example, recall that when generating playback timing for an individual frame (or packet), the "sourcing" playback device (i.e., the playback coordinator 710 in FIG. 7) adds a "timing advance" to the current clock time of the local reference clock used for generating the playback timing. So, if the timing advance for an individual frame is, for example, 30 milliseconds, then the playback coordinator 710 ultimately plays media content corresponding to the portion (e.g., a sample or set of samples) of media information 742*a* and/or 742*b* in an individual frame (or packet) 30 milliseconds after creating the playback timing for that individual frame (or packet).

And the playback device 714*a* and/or 714*b* plays media content corresponding to the media information 742*a* and/or 742*b* in each frame (or packet) when the current time of a local clock (at the playback device 714*a* and/or 714*b*) that the playback device 714*a* and/or 714*b* is using to play the media information 742*a* and/or 742*b* reaches the first playback timing information 744*b* and/or 744*b* for that frame (or packet), taking into account the previously-determined "timing offset."

Recall that the playback devices 714*a* and/or 714*b* calculate (or otherwise determine) a "timing offset" that corresponds to a difference between (a) the "reference" clock at the playback coordinator 710 that the playback coordinator 710 used to generate the clock timing information 746*a* and/or 746*b* (and the playback timing information 744*a* and/or 744*b*) and (b) the "local" clock at the playback devices 714*a* and/or 714*b* is used to play the media information 742*a* and/or 742*b*. The playback devices 714*a* and/or 714*b* use this timing offset when playing back media content based on the media information 742*a* and/or 742*b*.

In particular, the playback devices 714*a* and/or 714*b* generate new playback timing (specific to the respective playback device) for individual frames (or packets) of media information 742*a* and/or 742*b* by adding the previously determined "timing offset" to the playback time of each frame (or packet) received from the playback coordinator 710. With this approach, the playback devices 714*a* and/or 714*b* convert the playback timing information 744*a* and/or 744*b* received from the playback coordinator 710 into "local" playback timing for the respective playback device. And when the "local" clock that the respective playback device is using for playing back the media content reaches the determined "local" playback time for an individual frame (or packet), the respective playback device plays the media information 742*a* and/or 742*b* (or portions thereof) associated with that individual frame (or packet). As described above, in some embodiments, the playback timing for a particular frame (or packet) is in the header of the frame (or packet). In other embodiments, the playback timing for individual frames (or packets) is transmitted separately from the frames (or packets) comprising the media content.

Because the devices within configured 700 play media content corresponding to frames (or packets) comprising portions of the media information 742a and/or 742b according to the playback timing information 744a and/or 744b (and any calculated timing offset using the clock timing information 746a and/or 746b), the media content may be played back in synchrony (e.g., the media content played back by two or more of the playback devices 714a and 714b and the playback coordinator 710).

Figure 8:
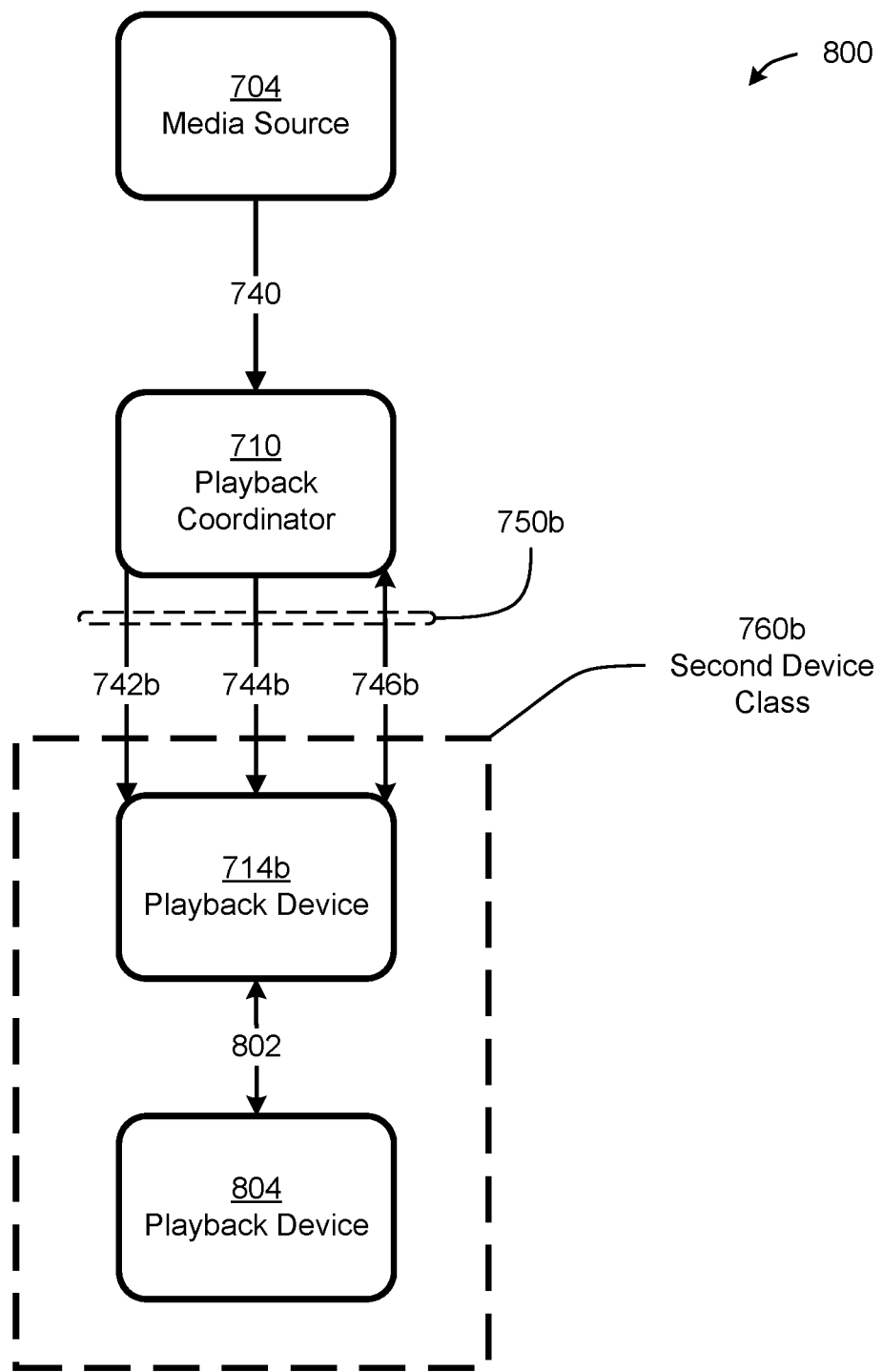
FIG. 8 shows another example configuration of a media playback group configured for synchronization.

In some instances, one or both of the playback devices 714a and/or 714b may repackage and transmit the media received from the playback coordinator 710 to one or more other devices within the same device class. FIG. 8 shows an example of such a configuration 800. As shown, the playback device 714b of the second device class 760b may generate (e.g., based on data stream 750b) and transmit a data stream 802 to another playback device 804 in the second device class 760b. For example, the playback device 714b may transmit the data stream 802 to the playback device 804 such that the playback device 804 and the playback device 714b may playback the portions of media information 742b in synchrony.

Figure 9:
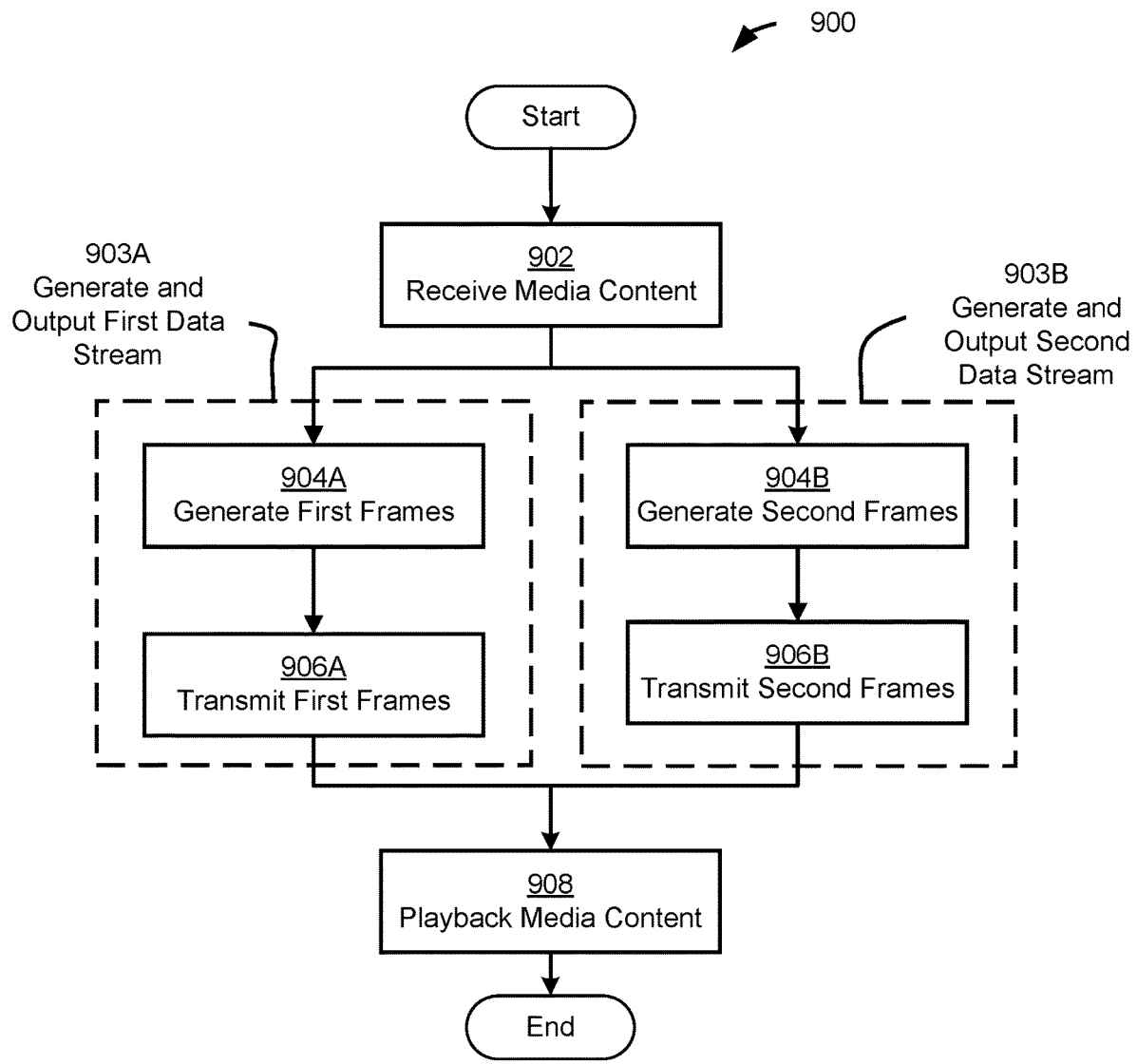
FIG. 9 shows an example method of operation for at least one device functioning as a playback coordinator.

FIG. 9 shows an example method 900 that may be performed by at least one device functioning as a playback coordinator, such as playback coordinator 710, to facilitate synchronous playback in a synchrony group that comprises devices of different classes (e.g., having different computational capabilities). The playback coordinator may assign playback devices in the synchrony group to the different classes (e.g., based on whether the playback device meet or fail to meet one or more thresholds for computational capability) or the playback devices may assign themselves and notify the playback coordinator of their self-assignment (e.g., via transmission of one or more messages to the playback coordinator).

As shown in FIG. 9, the method 900 comprises an act 902 of receiving media content, an act 903A of generating and outputting a first data stream that may comprise an act 904A of generating first frames and an act 906B of transmitting the second frames, an act 903B of generating and outputting a second data stream that may comprise an act 904B of generating second frames and an act 906B of transmitting the second frames, and an act 908 of playing pack the media content.

In act 902, the playback coordinator may receive media content. For example, the playback coordinator may receive the media content from a cloud-based media streaming service accessible over the Internet. In another example, the playback coordinator may receive the media content from a user device (e.g., over a BLUETOOTH network) or from a computing device on a common LAN (such as a Network-Attached-Storage (NAS) device on the same LAN). The media content may be encoded (or otherwise compressed), unencoded (or otherwise uncompressed), or any combination thereof.

In act 903A, the playback coordinator may generate and output a first data stream based on the media content (e.g., received in act 902) that is tailored for a first subset of playback devices in a synchrony group that are assigned to a first class. For instance, the first subset of playback devices in the synchrony group may comprise those playback devices in the synchrony group that meet or otherwise exceed one or more thresholds (e.g., sufficient processor capability (e.g., sufficient number of cores, sufficient floating point operations per second, sufficient clock speed, and/or sufficient cache size), sufficient volatile memory capability (e.g., sufficient capacity, sufficient bandwidth, and/or sufficient clock speed), and/or sufficient non-volatile memory capability (e.g., sufficient capacity, sufficient bandwidth, and/or sufficient clock speed)). In generating and outputting the first data stream, the playback coordinator may perform any of a variety of operations including, for example, an act 904A of generating first frames and an act 906A of transmitting the first frames.

In act 904A, the playback coordinator may generate first frames (e.g., for the first data stream) based on the media content (e.g., the media content received in act 902). The first frames may comprise portions of the media content and playback timing information associated with the portions of the media content. For instance, an individual frame in the first frames may comprise a portion of the media content and playback timing information associated with the portion of the media content. In another instance, the first frames may comprise multiple types of frames including a first type of frame for the portions of the media content and a second type of frame for the playback timing information associated with the portions of the media content. Accordingly, the individual frames within the first frames may be organized in accordance with any of a variety of formats.

In some implementations, the portions of the media content embedded into the first frames may be tailored to the capabilities of the first class of devices (e.g., the first subset of the playback devices). For instance, the media content (e.g., received in act 902) may be encoded using a codec (or otherwise compressed) and the playback devices in the first class (e.g., the first subset of playback devices) may be capable of decoding the encoded media content. In such an instance, the playback coordinator may leave the media content in an encoded form when generating the first frames (e.g., such that the media content portions in the first frames are still encoded).

In act 906A, the playback coordinator may transmit the first frames. For example, the playback coordinator may transmit the first frames to the first subset of playback devices in the synchrony group. The communication mechanism employed to transmit the first frames may vary based on the particular implementation and/or the capabilities of the playback devices in the first class (e.g., first subset of playback devices). For instance, all of the playback devices in the first class may be capable of communicating over a WLAN and the playback coordinator may transmit the first frames over the WLAN to the first subset of playback devices.

In act 903B, the playback coordinator may generate and output a second data stream based on the media content (e.g., received in act 902) that is tailored for a second subset of playback devices in a synchrony group that are in a second class. For instance, the second subset of playback devices in the synchrony group may comprise those playback devices in the synchrony group that fail to meet one or more thresholds (e.g., insufficient processor capability (e.g., insufficient number of cores, insufficient floating point operations per second, insufficient clock speed, and/or insufficient cache size), insufficient volatile memory capability (e.g., insufficient capacity, insufficient bandwidth, and/or insufficient clock speed), and/or insufficient non-volatile memory capability (e.g., insufficient capacity, insufficient bandwidth, and/or insufficient clock speed)). In generating and outputting the second data stream, the playback coordinator may perform any of a variety of operations including, for example, an act 904B of generating second frames and an act 906B of transmitting the second frames.

In act 904B, the playback coordinator may generate second frames (e.g., for the second data stream) based on the media content (e.g., the media content received in act 902). The second frames may comprise portions of the media content and playback timing information associated with the portions of the media content. For instance, an individual frame in the second frames may comprise a portion of the media content and playback timing information associated with the portion of the media content. In another instance, the second frames may comprise multiple types of frames including a first type of frame for the portions of the media content and a second type of frame for the playback timing information associated with the portions of the media content. Accordingly, the individual frames within the second frames may be organized in accordance with any of a variety of formats. Further, the individual frames within the second frames (e.g., generated in act 904B) may have a different format (or the same format) as individual frames in the first frames (e.g., generated in act 904A).

In some implementations, the portions of the media content embedded into the second frames may be tailored to the capabilities of the second class of devices (e.g., the second subset of the playback devices). For instance, the media content (e.g., received in act 902) may be encoded using a codec (or otherwise compressed) and the playback devices in the second class (e.g., the second subset of playback devices) may be incapable of decoding the encoded media content. In such an instance, the playback coordinator may decode (or otherwise decompress) the media content into an uncompressed state when generating the second frames. In turn, the playback coordinator may, depending on the particular implementation: (1) directly incorporate unencoded portions of the media content into the second frames or (2) re-encode the media content in accordance with another codec that is supported by the playback devices of the second class (e.g., the second subset of playback devices) and incorporate portions of the re-encoded media content into the second frames. Accordingly, the media content incorporated into the second frames may be in a different format relative to the media content incorporated into the first frames.

As discussed above, the playback coordinator may handle one or more aspects of playback device control differently for playback devices in the first class relative to the playback devices in the second class. In some implementations, the playback coordinator may effectuate adjustments to one or more audio playback settings (e.g., volume settings, equalization settings, etc.) for playback devices in the first class via transmission of one or more instructions to the playback devices of the first class (e.g., without modifying to the media content being incorporated into the first frames) and effectuate such adjustments to one or more audio playback settings for playback devices in the second class by modifying the media content (or any portion thereof) that is to be integrated into the second frames. For instance, the playback coordinator may receive a request to reduce the volume. For playback devices of the first class (e.g., in the first subset of playback devices), the playback coordinator may send an instruction to the respective playback devices comprising an indication of the new volume level for playback (and may also include an indication of when to switch to the new volume level). For playback devices of the second class, the playback coordinator may modify the media content to account for the volume change (e.g., by scaling down amplitudes of an audio signal) that is to be incorporated into the second frames. Accordingly, the playback coordinator can effectuate changes to the one or more audio settings for playback devices in the second class without transmission of separate instructions and/or messages. Such a design may advantageously simplify processing of such modifications to audio playback settings for playback devices in the second class.

In act 906B, the playback coordinator may transmit the second frames. For example, the playback coordinator may transmit the second frames to the second subset of playback devices in the synchrony group. The communication mechanism employed to transmit the second frames may vary based on the particular implementation and/or the capabilities of the playback devices in the second class (e.g., second subset of playback devices). The playback coordinator may transmit the second frames over a different network (or the same network) as transmission of the first frames in act 906A. For instance, the playback coordinator may transmit the second frames over a BLUETOOTH Network to the playback devices of the second class while transmitting the first frames over a WIFI network to the playback devices of the first class. In another instance, the playback coordinator may employ a WIFI network to both transmit the first frames to the playback devices of the first class and the second frames to the playback devices of the second class.

It should be appreciated that the act 903B of generating and outputting the second data stream may, in some implementations, be performed at least partially concurrently or otherwise in parallel with the act 903A of generating and outputting of the first data stream. For instance, the act 904A of generating the first frames may be performed at least partially concurrently or otherwise in parallel with the act 904B of generating the second frames and/or the act 906B of transmitting the second frames. Additionally (or alternatively), the act 906A of transmitting the first frames may be performed at least partially concurrently or otherwise in parallel with the act 904B of generating the second frames and/or the act 906B of transmitting the second frames.

In act 908, the playback coordinator may playback the media content in synchrony with the other playback devices in the synchrony group (e.g., each playback device of the first and second subsets of playback devices). The playback coordinator may playback the media content in synchrony using, for example, (1) portions of the media content generated as part of the first data stream (e.g., generated in act 904A) and/or the portions of the media content generated as part of the second stream (e.g., generated in act 904B); and (2) playback timing information generated as part of the first data stream (e.g., generated in act 904A) and/or playback timing information generated as part of the second data stream (e.g., generated in act 904B).

It should be appreciated that one or more acts in method 900 may be repeated, omitted, or otherwise modified without departing from the scope of the present disclosure. For example, one or more of acts 902, 904A, 904B, 906A, 906B, and/or 908 may be repeated throughout the duration of a playback session. Additionally (or alternatively), one or more of the acts may be omitted altogether. For instance, the playback coordinator may be a device that is outside the synchrony group or otherwise not to playback the media content and omit act 908 altogether. Still yet further, any two or more acts may be performed sequentially instead of concurrently or vice-versa. Accordingly, any of a variety of variations may be made to the method 900 without departing from the scope of the present disclosure.

V. Conclusion

The above discussions relating to playback devices, controller devices, playback zone configurations, and media/audio content sources provide only some examples of operating environments within which functions and methods described below may be implemented. Other operating environments and configurations of media playback systems, playback devices, and network devices not explicitly described herein may also be applicable and suitable for implementation of the functions and methods.

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only ways) to implement such systems, methods, apparatus, and/or articles of manufacture.

Additionally, references herein to "embodiment" means that a particular feature, structure, or characteristic described in connection with the embodiment can be included in at least one example embodiment of an invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the foregoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

Example Features (Feature 1) At least one device comprising: at least one communication interface configured to facilitate communication over at least one data network; at least one processor; at least one non-transitory computer-readable medium comprising program instructions that are executable by the at least one processor such that the playback coordinator is configured to: receive, via the at least one communication interface, media content from a media source; generate a first series of frames, wherein an individual frame in the first series of frames has a first format, and wherein the first series of frames comprises (i) first portions of the media content and (ii) first playback timing information comprising playback timing for the first portions of the media content; generate a second series of frames (e.g., at least partially concurrently or otherwise in parallel with the generation of the first series of frames), wherein an individual frame in the second series of frames has a second format that is different from the first format, and wherein the second series of frames comprises (i) second portions of the media content and (ii) second playback timing information comprising playback timing for the second portions of the media content; and transmit, via the at least one communication interface, a first stream of data comprising the first series of frames to at least one first playback device (e.g., a playback device of a first class of playback devices) (e.g., for playback of the first portions of the media content in accordance with the first playback timing information); and transmit, via the at least one communication interface, a second stream of data (e.g., at least partially concurrently or otherwise in parallel with transmission of the first stream of data) comprising the second series of frames to at least one second playback device (e.g., a playback device of a second class of playback devices that is different from the first class of playback devices) (e.g., for playback of the second portions of the media content in accordance with the second playback timing information such that the first and second portions of the media content are played back in synchrony).

(Feature 2) The at least one device of feature 1, wherein the at least one device is a playback device (e.g., operating in a playback coordinator mode).

(Feature 3) The at least one device of feature 2, wherein the at least one non-transitory computer-readable medium further comprises program instructions that are executable by the at least one processor such that the playback device is configured to: playback at least one of the first portions of media content or the second portions of media content in synchrony with the at least one first playback device and the at least one second playback device using at least one of the first playback timing information or the second playback timing information.

(Feature 4) A device comprising: at least one communication interface configured to facilitate communication over at least one data network; at least one processor; at least one non-transitory computer-readable medium comprising program instructions that are executable by the at least one processor such that the device is configured to: receive, via the at least one communication interface, media content from a media source; generate a first series of frames, wherein an individual frame in the first series of frames has a first format, and wherein the first series of frames comprises (i) first portions of the media content and (ii) first playback timing information comprising playback timing for the first portions of the media content; generate a second series of frames, wherein an individual frame in the second series of frames has a second format that is different from the first format, and wherein the second series of frames comprises (i) second portions of the media content and (ii) second playback timing information comprising playback timing for the second portions of the media content; transmit, via the at least one communication interface, the first series of frames to at least one first playback device in a synchrony group for playback of the first portions of the media content in accordance with the first playback timing information; and transmit, via the at least one communication interface, the second series of frames to at least one second playback device in the synchrony group for playback of the second portions of the media content in accordance with the second playback timing information such that the media content is played back in synchrony by the synchrony group.

(Feature 5) The device of feature 4, wherein the program instructions that are executable by the at least one processor such that the device is configured to generate the first series of frames comprises program instructions that are executable by the at least one processor such that the device is configured to: generate the first series of frames is at least partially in parallel with generation of the second series of frames.

(Feature 6) The device of feature 4 or 5, wherein the program instructions that are executable by the at least one processor such that the device is configured to transmit the first series of frames to the at least one first playback device comprises program instructions that are executable by the at least one processor such that the device is configured to: transmit the first series of frames to the at least one first playback device at least partially in parallel with transmission of the second series of frames to the at least one second playback device.

(Feature 7) The device of any of features 4-6, wherein the media content comprises encoded media content and wherein the at least one non-transitory computer-readable medium further comprises program instructions that are executable by the at least one processor such that the device is configured to: decode the encoded media content into unencoded media content.

(Feature 8) The device of feature 7, wherein the first portions of the media content comprises portions of the encoded media content and wherein the second portions of the media content comprise portions of the unencoded media content.

(Feature 9) The device of any of features 4-8, wherein the at least one non-transitory computer-readable medium further comprises program instructions that are executable by the at least one processor such that the device is configured to: after receipt of a command to modify at least one audio playback setting, (i) cause the at least one first playback device to modify the at least one audio playback setting; and (ii) cause the at least one second playback device to modify the at least one audio playback setting.

(Feature 10) The device of feature 9, wherein the at least one audio playback setting comprises at least one of: a volume setting or an equalization setting.

(Feature 11) The device of feature 9 or 10, wherein the program instructions that are executable by the at least one processor such that the device is configured to cause the at least one first playback device to modify the at least one audio playback setting comprises program instructions that are executable by the at least one processor such that the device is configured to: transmit at least one instruction to the at least one first playback device to modify the at least one audio playback setting.

(Feature 12) The device of feature 11, wherein the program instructions that are executable by the at least one processor such that the device is configured to cause the at least one second playback device to modify the at least one audio playback setting comprises program instructions that are executable by the at least one processor such that the device is configured to: modify the second portions of the media content based on the command to modify the at least one audio playback setting.

(Feature 13) The device of any of features 4-12, further comprising at least one audio amplifier and wherein the at least one non-transitory computer-readable medium further comprises program instructions that are executable by the at least one processor such that the device is configured to: play back, using the at least one audio amplifier, the media content in synchrony with the at least one first playback device and the at least one second playback device based on at least one of the first playback timing information or the second playback timing information.

(Feature 14) A method performed by a device, the method comprising: receiving, via at least one communication interface of the device, media content from a media source; generating a first series of frames, wherein an individual frame in the first series of frames has a first format, and wherein the first series of frames comprises (i) first portions of the media content and (ii) first playback timing information comprising playback timing for the first portions of the media content; generating a second series of frames, wherein an individual frame in the second series of frames has a second format that is different from the first format, and wherein the second series of frames comprises (i) second portions of the media content and (ii) second playback timing information comprising playback timing for the second portions of the media content; transmitting, via the at least one communication interface, the first series of frames to at least one first playback device in a synchrony group for playback of the first portions of the media content in accordance with the first playback timing information; and transmitting, via the at least one communication interface, the second series of frames to at least one second playback device in the synchrony group for playback of the second portions of the media content in accordance with the second playback timing information such that the media content is played back in synchrony by the synchrony group.

(Feature 15) The method of feature 14, wherein generating the first series of frames comprises: generating the first series of frames is at least partially in parallel with generating the second series of frames.

(Feature 16) The method of feature 14 or 15, wherein transmitting the first series of frames comprises: transmitting the first series of frames at least partially in parallel with transmitting the second series of frames.

(Feature 17) The method of any of features 14-16, wherein receiving the media content comprises receiving encoded media content and wherein the method further comprises: decoding the encoded media content into unencoded media content.

(Feature 18) The method of any of features 17, wherein generating the first series of frames comprises incorporating portions of the encoded media content into the first series of frames and wherein generating the second series of frames comprises incorporating portions of the unencoded media content into the second series of frames.

(Feature 19) The method of any of features 14-18, further comprising: receiving a command to modify at least one audio playback setting; causing the at least one first playback device to modify the at least one audio playback setting; and causing the at least one second playback device to modify the at least one audio playback setting.

(Feature 20) The method of feature 19, wherein receiving the command to modify the at least one audio playback setting comprises receiving a command to modify at least one of: a volume setting or an equalization setting.

(Feature 21) The method of feature 19 or 20, wherein causing the at least one first playback device to modify the at least one audio playback setting comprises: transmitting at least one instruction to the at least one first playback device to modify the at least one audio playback setting.

(Feature 22) The method of any of features 19-21, wherein causing the at least one second playback device to modify the at least one audio playback setting comprises: modifying the second audio portions based on the command to modify the at least one audio playback setting.

(Feature 23) At least one non-transitory computer-readable medium comprising program instructions that are executable by at least one processor such that a device is configured to: receive, via at least one communication interface of the device, media content from a media source; generate a first series of frames, wherein an individual frame in the first series of frames has a first format, and wherein the first series of frames comprises (i) first portions of the media content and (ii) first playback timing information comprising playback timing for the first portions of the media content; generate a second series of frames, wherein an individual frame in the second series of frames has a second format that is different from the first format, and wherein the second series of frames comprises (i) second portions of the media content and (ii) second playback timing information comprising playback timing for the second portions of the media content; transmit, via the at least one communication interface, the first series of frames to at least one first playback device in a synchrony group for playback of the first portions of the media content in accordance with the first playback timing information; and transmit, via the at least one communication interface, the second series of frames to at least one second playback device in the synchrony group for playback of the second portions of the media content in accordance with the second playback timing information such that the media content is played back in synchrony by the synchrony group.

(Feature 24) A playback device comprising: at least one communication interface configured to facilitate communication over at least one data network; at least one processor; at least one non-transitory computer-readable medium comprising program instructions that are executable by the at least one processor such that the device is configured to: join a synchrony group comprising a plurality of playback devices; for each of at least some of the plurality of playback devices, (i) determine whether the respective playback device has a capability that exceeds a threshold (e.g., sufficient processor capability (e.g., sufficient number of cores, sufficient floating point operations per second, sufficient clock speed, and/or sufficient cache size), sufficient volatile memory capability (e.g., sufficient capacity, sufficient bandwidth, and/or sufficient clock speed), and/or sufficient non-volatile memory capability (e.g., sufficient capacity, sufficient bandwidth, and/or sufficient clock speed)), and (ii) assign the respective playback device to one of a plurality of classes comprising a first class and a second class based on the determination whether the respective playback device has the capability that exceeds the threshold; receive, via the at least one communication interface, media content from a media source; generate a first series of frames, wherein an individual frame in the first series of frames has a first format, and wherein the first series of frames comprises (i) first portions of the media content and (ii) first playback timing information comprising playback timing for the first portions of the media content; generate a second series of frames, wherein an individual frame in the second series of frames has a second format that is different from the first format, and wherein the second series of frames comprises (i) second portions of the media content and (ii) second playback timing information comprising playback timing for the second portions of the media content; transmit, via the at least one communication interface, the first series of frames to those playback device(s) in the synchrony group assigned to the first class for playback of the first portions of the media content in accordance with the first playback timing information; and transmit, via the at least one communication interface, the second series of frames to those playback device(s) in the synchrony group assigned to the second class for playback of the second portions of the media content in accordance with the second playback timing information such that the media content is played back in synchrony by the synchrony group.

What is claimed is:

1. A device comprising:
   at least one communication interface configured to facilitate communication over at least one data network;
   at least one processor;
   at least one non-transitory computer-readable medium comprising program instructions that are executable by the at least one processor such that the device is configured to:
   receive, via the at least one communication interface, media content from a media source that has been encoded using a first audio codec;
   generate a first series of frames, wherein the first series of frames comprises (i) first portions of the encoded media content and (ii) first playback timing information comprising playback timing for the first portions of the encoded media content;
   update second portions of the encoded media content to be compressed differently than the first portions of the encoded media content, wherein the updated second portions are not encoded using the first audio codec;
   generate a second series of frames, wherein the second series of frames comprises (i) the updated second portions of the differently-compressed media content and (ii) second playback timing information comprising playback timing for the updated second portions of the differently-compressed media content;
   transmit, via the at least one communication interface, the first series of frames to at least one first playback device in a synchrony group for playback of the first portions of the encoded media content in accordance with the first playback timing information; and
   transmit, via the at least one communication interface, the second series of frames to at least one second playback device in the synchrony group for playback of the updated second portions of the differently-compressed media content in accordance with the second playback timing information such that the encoded media content and the differently-compressed media content are played back in synchrony by the synchrony group.

2. The device of claim 1, wherein the program instructions that are executable by the at least one processor such that the device is configured to generate the first series of frames comprise program instructions that are executable by the at least one processor such that the device is configured to:
   generate the first series of frames at least partially in parallel with generation of the second series of frames.

3. The device of claim 2, wherein the program instructions that are executable by the at least one processor such that the device is configured to transmit the first series of frames to the at least one first playback device comprise program instructions that are executable by the at least one processor such that the device is configured to:
   transmit the first series of frames to the at least one first playback device at least partially in parallel with transmission of the second series of frames to the at least one second playback device.

4. The device of claim 1, wherein the program instructions that are executable by the at least one processor such that the device is configured to update the second portions of the encoded media content to be compressed differently than the first portions of the encoded media content comprise program instructions that are executable by the at least one processor such that the device is configured to:
  decode the second portions of the encoded media content into unencoded media content.

5. The device of claim 1, further comprising program instructions that are executable by the at least one processor such that the device is configured to:
  after receipt of a command to modify at least one audio playback setting, (i) cause the at least one first playback device to modify the at least one audio playback setting, and (ii) cause the at least one second playback device to modify the at least one audio playback setting.

6. The device of claim 5, wherein the at least one audio playback setting comprises at least one of: a volume setting or an equalization setting.

7. The device of claim 5, wherein the program instructions that are executable by the at least one processor such that the device is configured to cause the at least one first playback device to modify the at least one audio playback setting comprise program instructions that are executable by the at least one processor such that the device is configured to:
  transmit at least one instruction to the at least one first playback device to modify the at least one audio playback setting.

8. The device of claim 7, wherein the program instructions that are executable by the at least one processor such that the device is configured to cause the at least one second playback device to modify the at least one audio playback setting comprise program instructions that are executable by the at least one processor such that the device is configured to:
  modify the updated second portions of the differently-compressed media content based on the command to modify the at least one audio playback setting.

9. The device of claim 1, further comprising at least one audio amplifier, further comprising program instructions that are executable by the at least one processor such that the device is configured to:
  play back, using the at least one audio amplifier, the encoded media content in synchrony with the synchrony group based on the first playback timing information.

10. A method performed by a device, the method comprising:
  receiving, via at least one communication interface of the device, media content from a media source that has been encoded using a first audio codec;
  generating a first series of frames, wherein the first series of frames comprises (i) first portions of the encoded media content and (ii) first playback timing information comprising playback timing for the first portions of the encoded media content;
  updating second portions of the encoded media content to be compressed differently than the first portions of the encoded media content, wherein the updated second portions are not encoded using the first audio codec;
  generating a second series of frames, wherein the second series of frames comprises (i) the updated second portions of the differently-compressed media content and (ii) second playback timing information comprising playback timing for the updated second portions of the differently-compressed media content;
  transmitting, via the at least one communication interface, the first series of frames to at least one first playback device in a synchrony group for playback of the first portions of the encoded media content in accordance with the first playback timing information; and
  transmitting, via the at least one communication interface, the second series of frames to at least one second playback device in the synchrony group for playback of the updated second portions of the differently-compressed media content in accordance with the second playback timing information such that the encoded media content and the differently-compressed media content are played back in synchrony by the synchrony group.

11. The method of claim 10, wherein generating the first series of frames comprises:
  generating the first series of frames at least partially in parallel with generating the second series of frames.

12. The method of claim 11, wherein transmitting the first series of frames comprises:
  transmitting the first series of frames at least partially in parallel with transmitting the second series of frames.

13. The method of claim 10, wherein updating the second portions of the encoded media content comprises:
  decoding the second portions of the encoded media content into unencoded media content.

14. The method of claim 10, further comprising:
  receiving a command to modify at least one audio playback setting;
  causing the at least one first playback device to modify the at least one audio playback setting; and
  causing the at least one second playback device to modify the at least one audio playback setting.

15. The method of claim 14, wherein receiving the command to modify the at least one audio playback setting comprises receiving a command to modify at least one of: a volume setting or an equalization setting.

16. The method of claim 14, wherein causing the at least one first playback device to modify the at least one audio playback setting comprises:
  transmitting at least one instruction to the at least one first playback device to modify the at least one audio playback setting.

17. The method of claim 16, wherein causing the at least one second playback device to modify the at least one audio playback setting comprises:
  modifying the updated second portions of the differently-compressed media content based on the command to modify the at least one audio playback setting.

18. At least one non-transitory computer-readable medium comprising program instructions that are executable by at least one processor such that a device is configured to:
  receive, via at least one communication interface of the device, media content from a media source that has been encoded using a first audio codec;
  generate a first series of frames, wherein the first series of frames comprises (i) first portions of the encoded media content and (ii) first playback timing information comprising playback timing for the first portions of the encoded media content;
  update second portions of the encoded media content to be compressed differently than the first portions of the encoded media content, wherein the updated second portions are not encoded using the first audio codec;
  generate a second series of frames, wherein the second series of frames comprises (i) the updated second portions of the differently-compressed media content and (ii) second playback timing information comprising playback timing for the updated second portions of the differently-compressed media content;

transmit, via the at least one communication interface, the first series of frames to at least one first playback device in a synchrony group for playback of the first portions of the encoded media content in accordance with the first playback timing information; and transmit, via the at least one communication interface, the second series of frames to at least one second playback device in the synchrony group for playback of the updated second portions of the differently-compressed media content in accordance with the second playback timing information such that the media content and the differently-compressed media content are played back in synchrony by the synchrony group.

19. The at least one non-transitory computer-readable medium of claim 18, wherein the program instructions that are executable by at least one processor such that the device is configured to generate the first series of frames comprise program instructions that are executable by at least one processor such that the device is configured to:

generate the first series of frames at least partially in parallel with generation of the second series of frames.

20. The at least one non-transitory computer-readable medium of claim 19, wherein the program instructions that are executable by at least one processor such that the device is configured to transmit the first series of frames to the at least one first playback device comprise program instructions that are executable by at least one processor such that the device is configured to:

transmit the first series of frames to the at least one first playback device at least partially in parallel with transmission of the second series of frames to the at least one second playback device.

\* \* \* \* \*